United States Patent
Tohidian et al.

(10) Patent No.: US 9,641,164 B2
(45) Date of Patent: May 2, 2017

(54) QUADRATURE LC TANK DIGITALLY CONTROLLED RING OSCILLATOR

(71) Applicant: Technische Universiteit Delft, Delft (NL)

(72) Inventors: Massoud Tohidian, Delft (NL); Robert Bogdan Staszewski, Delft (NL); Ali Fotowat Ahmady, Delft (NL); Seyed Amir Reza Ahmadi Mehr, Delft (NL); Mahmoud Kamarei, Delft (NL); Fabien Ndagijimana, Delft (NL)

(73) Assignee: Technische Universiteit Delft, Delft (NL)

( * ) Notice: Subject to any disclaimer, the term of this patent is extended or adjusted under 35 U.S.C. 154(b) by 0 days.

(21) Appl. No.: 14/547,868

(22) Filed: Nov. 19, 2014

(65) Prior Publication Data

US 2015/0372665 A1   Dec. 24, 2015

Related U.S. Application Data

(60) Provisional application No. 62/016,399, filed on Jun. 24, 2014.

(51) Int. Cl.
*H03K 3/03*  (2006.01)
*H03K 5/133*  (2014.01)
(Continued)

(52) U.S. Cl.
CPC .............. *H03K 5/133* (2013.01); *H03B 5/124* (2013.01); *H03B 5/1212* (2013.01);
(Continued)

(58) Field of Classification Search
CPC .... H03K 3/0315; H03K 3/0322; H03K 5/133; H03K 3/011; H03B 5/1228;
(Continued)

(56) References Cited

U.S. PATENT DOCUMENTS 5,252,929 A * 10/1993 Taroumaru ........... H03G 3/3042
                                                          330/129
5,561,399 A * 10/1996 Haartsen .............. H03B 5/1221
                                                          331/117 R
(Continued)

FOREIGN PATENT DOCUMENTS

WO   WO 00/44093    7/2000
WO   WO 2015158387  * 10/2015

OTHER PUBLICATIONS

Author: Donghyun Baek, Taeksang Song, Euisik Yoon and Songcheol Hong Title: 8-GHz CMOS Quadrature VCO Using Transformer-Based LC Tank Date: Oct. 2003 Publisher: IEEE Microwave and Wireless Components Letters; vol. 13, No. 10.*

(Continued)

*Primary Examiner* — Richard Tan
(74) *Attorney, Agent, or Firm* — Zaretsky Group PC; Howard Zaretsky

(57) ABSTRACT

A quadrature LC tank based digitally controlled ring oscillator (DCO). The oscillator structure incorporates a plurality of stages, each stage including a buffer and a series LC tank. Four stages are coupled together to create a 360 degree phase shift around a loop. The oscillation frequency of the oscillator is the same as the resonant frequency of each LC tank, therefore it avoids quality factor degradation of LC tanks found in the prior art. In one example embodiment, class-D amplifiers are used to drive each of the LC tanks. Capacitor banks before at the input and output of the buffers provide coarse and fine tuning of the frequency of oscillation. The high efficiency exhibited by these amplifiers results in very good phase noise performance of this oscillator. The oscillator utilizes a startup circuit to launch oscillation upon power on.

29 Claims, 25 Drawing Sheets

(51) Int. Cl.
*H03K 3/011* (2006.01)
*H03B 5/12* (2006.01)
*H03B 27/00* (2006.01)

(52) U.S. Cl.
CPC ............ *H03B 5/1228* (2013.01); *H03B 27/00* (2013.01); *H03K 3/011* (2013.01); *H03K 3/0322* (2013.01); *H03B 2200/0074* (2013.01)

(58) Field of Classification Search
CPC .................. H03B 5/1212; H03B 27/00; H03B 2200/0074; H03B 5/124
USPC .......................................................... 331/57
See application file for complete search history.

(56) References Cited

U.S. PATENT DOCUMENTS

| | | | | |
|---|---|---|---|---|
| 5,936,475 | A * | 8/1999 | Tchamov | H03K 3/0231 327/266 |
| 7,286,625 | B2 | 10/2007 | Lee et al. | |
| 7,336,134 | B1 * | 2/2008 | Janesch | H03L 7/0991 331/117 R |
| 2003/0052723 | A1 * | 3/2003 | Forbes | H03K 3/0315 327/295 |
| 2009/0085681 | A1 * | 4/2009 | Lin | H03B 5/1221 331/111 |
| 2011/0001521 | A1 * | 1/2011 | Lorenzon | H03K 23/52 327/115 |
| 2013/0154691 | A1 * | 6/2013 | Li | G06F 1/06 327/117 |
| 2015/0381157 | A1 | 12/2015 | Andreani et al. | |

OTHER PUBLICATIONS

A. Rofougaran et al., "A 900 MHz CMOS LC-Oscillator with Quadrature Outputs," IEEE Solid-State Cir. Conf., pp. 392-393, Feb. 1996.

L.C. Cho et al., "A 1.2-V 37-38.5-GHz Eight-Phase Clock Generator in 0.13-µm CMOS Technology," IEEE J. Solid-State Cir., vol. 42, No. 6, pp. 1261-1270, Jun. 2007.

J.J. Kim et al., "A Low-Phase-Noise CMOS LC Oscillator with a Ring Structure," IEEE Solid-State Cir. Conf., pp. 430-432, Feb. 2000.

P. Andreani et al., "Analysis and Design of a 1.8-GHz CMOS LC Quadrature VCO," IEEE J. Solid-State Cir., vol. 37, No. 12, pp. 1737-1747, Dec. 2002.

J. Savoj et al.,"A 10-Gb/s CMOS Clock and Data Recovery Circuit With a Half-Rate Binary Phase/Frequency Detector", IEEE J. Solid-State Cir., vol. 38, No. 1, pp. 13-21, Jan. 2003.

A. Hajimiri et al., "A General Theory of Phase Noise in Electrical Oscillators," IEEE J. Solid-State Cir., vol. 33, No. 2, pp. 179-194, Feb. 1998.

J. Wood et al., "Rotary Traveling-Wave Oscillator Arrays: A New Clock Technology," IEEE J. Solid-State Cir., vol. 36, No. 11, pp. 1654-1665, Nov. 2001.

J. Lee et al., "A 40-Gb/s Clock and Data Recovery Circuit in 0.18-µm CMOS Technology," IEEE J. Solid-State Cir., vol. 38, No. 12, pp. 2181-2190, Dec. 2003.

J.E. Rogers et al., "A 10-Gb/s CDR/DEMUX with LC Delay Line VCO in 0.18-µm CMOS," IEEE J. Solid-State Cir., vol. 37, No. 12, pp. 1781-1789, Dec. 2002.

A. Mazzanti et al., "A 1.8-GHz Injection-Locked Auadrature CMOS VCO With Low Phase Noise and High Phase Accuracy," IEEE Trans. Cir. Sys., vol. 53, No. 3, pp. 554-560, Mar. 2006.

O. Nizhnik, et. al., "Low Noise Wide Tuning Range Quadrature Ring Oscillator for Multi-Standard Transceiver," IEEE Microwave Wire. Comp., vol. 19, No. 7, pp. 470-472, Jul. 2009.

S. Yoo et. al., "A 2-8 GHz Wideband Dually Frequency-Tuned Ring-VCO With a Scalable Kvco," IEEE Microwave Wire. Comp, vol. 23, No. 11, pp. 602-604, Nov. 2013.

G. Li et al., "A Low-Phase-Noise Multi-Phase Oscillator Based on Left-Handed LC-Ring," IEEE J. Solid-State Cir., vol. 45, No. 9, pp. 1822-1833, Sep. 2010.

T. Nakamura et. al., "A ΔΣ-Modulator-Less Digitally-Controlled Oscillator Using Fractional Capacitors for GSM/EDGE Transmitter," IEEE ESSCIRC, pp. 410-413, Mar. 2012.

* cited by examiner

QUADRATURE LC TANK DIGITALLY CONTROLLED RING OSCILLATOR

REFERENCE TO PRIORITY APPLICATION

This application claims priority to U.S. Provisional Application Ser. No. 62/016,399, filed Jun. 24, 2014, entitled "Series LC Ring Oscillator," incorporated herein by reference in its entirety.

FIELD OF THE INVENTION

The present invention relates generally to digitally controlled oscillators (DCO) and in particular to a quadrature LC tank based digitally controlled ring oscillator.

BACKGROUND OF THE INVENTION

Clock generator circuits are well known circuits that are used in a myriad of applications. In modern integrated wireless/wireline receivers, transmitters and transceivers, as well as digital processors and system-on-chip (SoC) circuits, clock generator circuits are an essential block. In particular, quadrature clock generator circuits are often used to generate multiple clock signals 90 degrees apart from each other. To reach a very high data rate in clock and data recovery integrated circuits, a multiphase oscillator is typically used. A common way to generate quadrature clock signals, is to use a conventional ring oscillator. In ring oscillators, oscillation is made based on inverter delay with capacitive and/or resistive load. A drawback with these types of oscillators though is that the phase noise is relatively high compared to LC type of oscillators.

A circuit diagram illustrating an example prior art LC type oscillator with quadrature outputs is shown in FIG. 1. The oscillator, generally referenced 10, comprises two cross coupled LC oscillators, namely oscillator A and oscillator B. The first oscillator is coupled in-phase to the second, but the second one is coupled anti-phase to the first. MOS transistors are used as the coupling devices. This idea can be extended by coupling a higher number of oscillators as shown in FIG. 2. A circuit diagram illustrating an example prior art LC type oscillator with an additional number of oscillators is shown in FIG. 2. The structure, generally referenced 20, allows an additional number of different phases to be generated.

In the oscillators of FIGS. 1 and 2, coupling the oscillators forces the oscillation frequency to be shifted away from the resonant frequency of each LC tank. Therefore, each tank shows a lower quality factor Q. In this way, quadrature accuracy can be traded-off with phase noise. The higher the coupling strength the better the in-phase/quadrature (IQ) phase accuracy, but the worse the oscillation phase noise.

A circuit diagram illustrating an example prior art multiphase LC type ring oscillator is shown in FIG. 3A. A circuit diagram illustrating an example implementation of each stage of the oscillator of FIG. 3A in more detail is shown in FIG. 3B. FIG. 3A shows a multiphase LC ring oscillator, generally referenced 30, that utilizes a parallel LC tank instead of a resistive/capacitive load as used in prior art conventional ring oscillators. The circuit, generally referenced 40, for each stage of oscillator 30 is shown in FIG. 3B.

Since it has a much higher open loop Q than the conventional ring oscillator, it has substantially better phase noise performance for the same current consumption. Compared to the oscillator of FIG. 1, cross-coupled pairs are eliminated in the structure of FIG. 3A to avoid potential parasitic oscillation modes. In this oscillator structure, oscillation frequency is still different than the resonant frequency of each LC tank. Therefore, each LC tank shows a lower quality factor resulting in a worse phase noise. In the above three types of prior art oscillators (i.e. FIGS. 1, 2, and 3A), active coupling devices inject a current into an LC tank that is not in-phase with the voltage of the tank. Consequently, noise from the coupling device is converted to phase noise with a higher gain, compared to the case where injected current is in-phase with the voltage of the tank.

A circuit diagram illustrating an example prior art rotary traveling-wave oscillator (RTWO) is shown in FIG. 4. The structure of the RTWO, generally referenced 50, is the rotary ring composed of a differential transmission line and several active devices to compensate losses. As a wave starts to propagate around the loop, it travels 360 degrees in each rotation cycle. The use of high quality passive resonators (especially the inductors and transmission lines) results in better phase noise performance compared to a conventional ring oscillator. As transistors of the inverters enter the triode region, however, the total quality factor Q of the resonator decreases and consequently degrades phase noise performance. Note that an alternative version of the RTWO can be implemented using lumped components.

A circuit diagram illustrating an example prior art multiphase LC type ring oscillator is shown in FIG. 5A. A circuit diagram illustrating an example implementation of a negative $G_m$ cell stage of the oscillator of FIG. 5A in more detail is shown in FIG. 5B.

In this implementation, the oscillator, generally referenced 60, comprises negative $G_m$ elements that are each implemented by a pair of current biased inverters shown in circuit 70 in FIG. 5B. In this manner, the inverters do not load the quality factor Q of the tank. The resonant frequency of the oscillator of FIG. 5A is less than the resonant frequency of a single LC tank, making it less attractive for high frequency applications.

A circuit diagram illustrating an example prior art multiphase ring oscillator using a CL ladder configuration is shown in FIG. 6. The oscillator, generally referenced 80, is constructed as a multiphase oscillator. This oscillator uses a CL ladder rather than an LC ladder by swapping the positions of L and C. It can be shown that in an eight phase oscillator, the CL ladder configuration provides a higher resonant frequency than a LC ladder. In addition, the oscillation frequency of this oscillator is higher than the resonant frequency of a single CL tank. The oscillation frequency, however, cannot go above the resonant frequency of the inductor and parasitic parallel capacitance of the active devices.

A circuit diagram illustrating an example prior art LC delay line oscillator is shown in FIG. 7A. A circuit diagram illustrating an example implementation of a gain stage of the oscillator of FIG. 7A in more detail is shown in FIG. 7B. The oscillator structure, generally referenced 90, comprises an LC delay line oscillator configuration. In this structure, four LC delay lines are used in a loop, with each delay line driven by a gain stage 100 shown in FIG. 7B.

In this circuit, the output load resistance of the gain stage matches the characteristic impedance of the delay line. In this oscillator, most of delay around the oscillator loop is provided by the delay line, making the VCO resistant to variations in power supply, temperature and process. The oscillator frequency is the same as the resonant frequency of the LC delay line. The use of an LC tank improves the phase noise of this structure compared to conventional ring oscillators. The use of resistively loaded gain stages, however, introduces extra loss in the oscillator, making it less power and phase noise efficient.

There is thus a need for an oscillator that overcomes the disadvantages of the prior art oscillator circuits. Preferably, the oscillator is able to generate quadrature phase output signals, is simple and accurate, exhibits low phase noise, has a low cost of manufacturing, is power efficient and consumes relatively little semiconductor real estate.

SUMMARY OF THE INVENTION

The present invention is a quadrature LC tank based digitally controlled ring oscillator (DCO). The oscillator structure incorporates a plurality of stages, each stage including an inverter and a series LC tank. Four stages are coupled together to create a 360 degree phase shift around a loop. The oscillation frequency of the oscillator is the same as the resonant frequency of each LC tank, therefore it avoids quality factor degradation of LC tanks found in the prior art. In one example embodiment, class-D amplifiers are used to drive each of the LC tanks. Capacitor banks at the input and output of the buffers provide coarse and fine tuning of the frequency of oscillation. The high efficiency exhibited by these amplifiers results in very good phase noise performance of this oscillator. The oscillator utilizes a startup circuit to launch oscillation upon power on.

There is thus provided in accordance with the invention, a ring oscillator comprising a plurality of phase shifters configured in a loop, a plurality of active circuits, each active circuit coupled to and associated with one of the phase shifters and wherein a gain of the plurality of active circuits combined with voltage amplification of the phase shifters causes the loop to oscillate.

There is also provided in accordance with the invention, a ring oscillator comprising a plurality of LC-tank based phase shifters configured in a loop, a plurality of amplifiers, each amplifier coupled to and associated with one of the phase shifters, wherein the gain of the plurality of amplifiers combined with voltage amplification of the phase shifters is sufficient to maintain oscillation in the loop and a startup circuit operative to inject one or more pulses into the loop to launch the oscillation.

There is further provided in accordance with the invention, a quadrature ring oscillator comprising a plurality of four 90 degree phase shifters configured in a loop, a plurality of four active circuits, each active circuit coupled in series with one of the phase shifters, a plurality of tuning capacitors, each tuning capacitor coupled to and associated with one of the active circuits, wherein a gain of the plurality of active circuits combined with voltage amplification of the phase shifters is sufficient to maintain oscillation in the loop and a startup circuit operative to inject one or more pulses into the loop to launch the oscillation.

BRIEF DESCRIPTION OF THE DRAWINGS

The invention is herein described, by way of example only, with reference to the accompanying drawings, wherein.

DETAILED DESCRIPTION OF THE INVENTION

The present invention is a quadrature LC tank based digitally controlled ring oscillator. Note that, alternatively, one skilled in the art can implement analog tuning for use in analog PLLs. The oscillator structure incorporates a plurality of LC tanks, such as four, to create a 360 degree phase shift around a loop. The oscillation frequency of the oscillator is the same as the resonant frequency of each LC tank, therefore it avoids quality factor degradation of LC tanks found in the prior art. In one example embodiment, class-D amplifiers are used to drive each of the LC tanks. The high efficiency exhibited by these amplifiers results in very good phase noise performance of this oscillator. The oscillator utilizes a startup circuit to launch oscillation upon power on.

The phase noise exhibited by an oscillator is among the most important criterion of an oscillator. In addition to phase noise (PN), important performance criteria include the active area, fine tuning steps and high phase accuracy which are also critical in many applications. While minimizing PN, the focus is also typically on cost and area. Most communication systems require high accuracy quadrature clocks. Ultrafine tuning steps are also required to reach a high modulation accuracy and low quantization noise in a digitally controlled oscillator that is part of a digital PLL.

In one embodiment, the present invention is a quadrature series LC tank ring oscillator (RO) that uses high-efficiency class-D amplifiers. A first DCO constructed in accordance with the present invention uses ultra-small low-Q inductors to achieve a very low semiconductor area while maintaining high purity referred to as the "LA" version. A second DCO constructed in accordance with the present invention uses larger inductors to achieve very low phase noise while featuring very high I/Q accuracy and ultra-fine tuning steps referred to as a high-performance or "HP" version.

Figure 1:
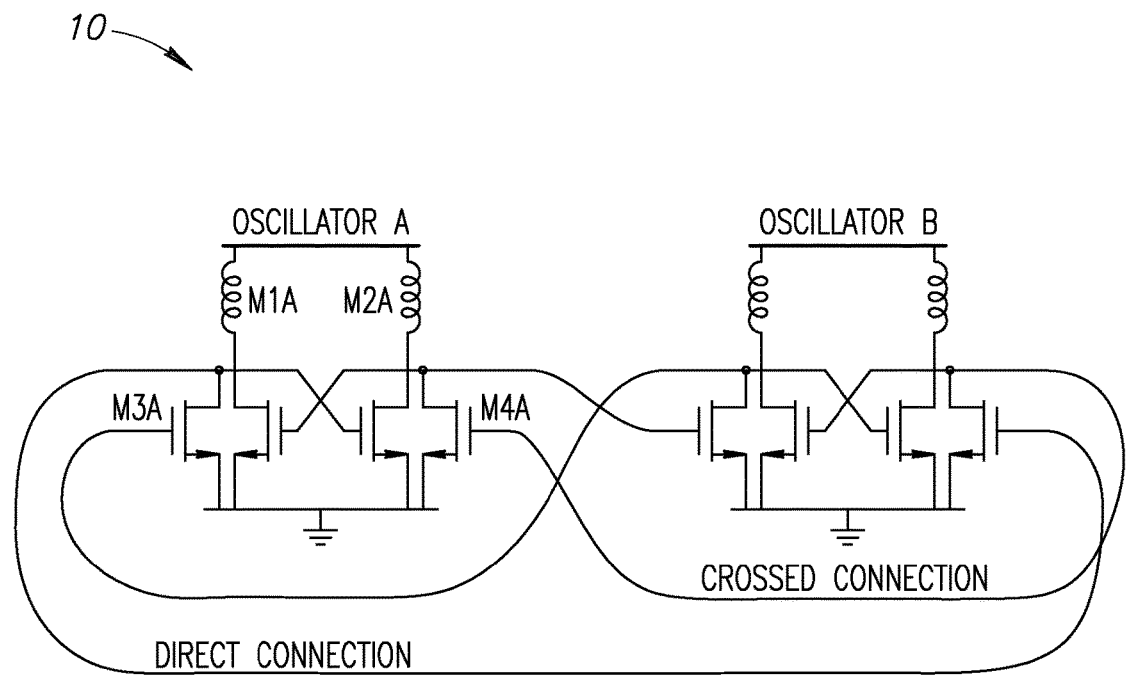
FIG. 1 is a circuit diagram illustrating an example prior art LC type oscillator with quadrature outputs.
Figure 2:
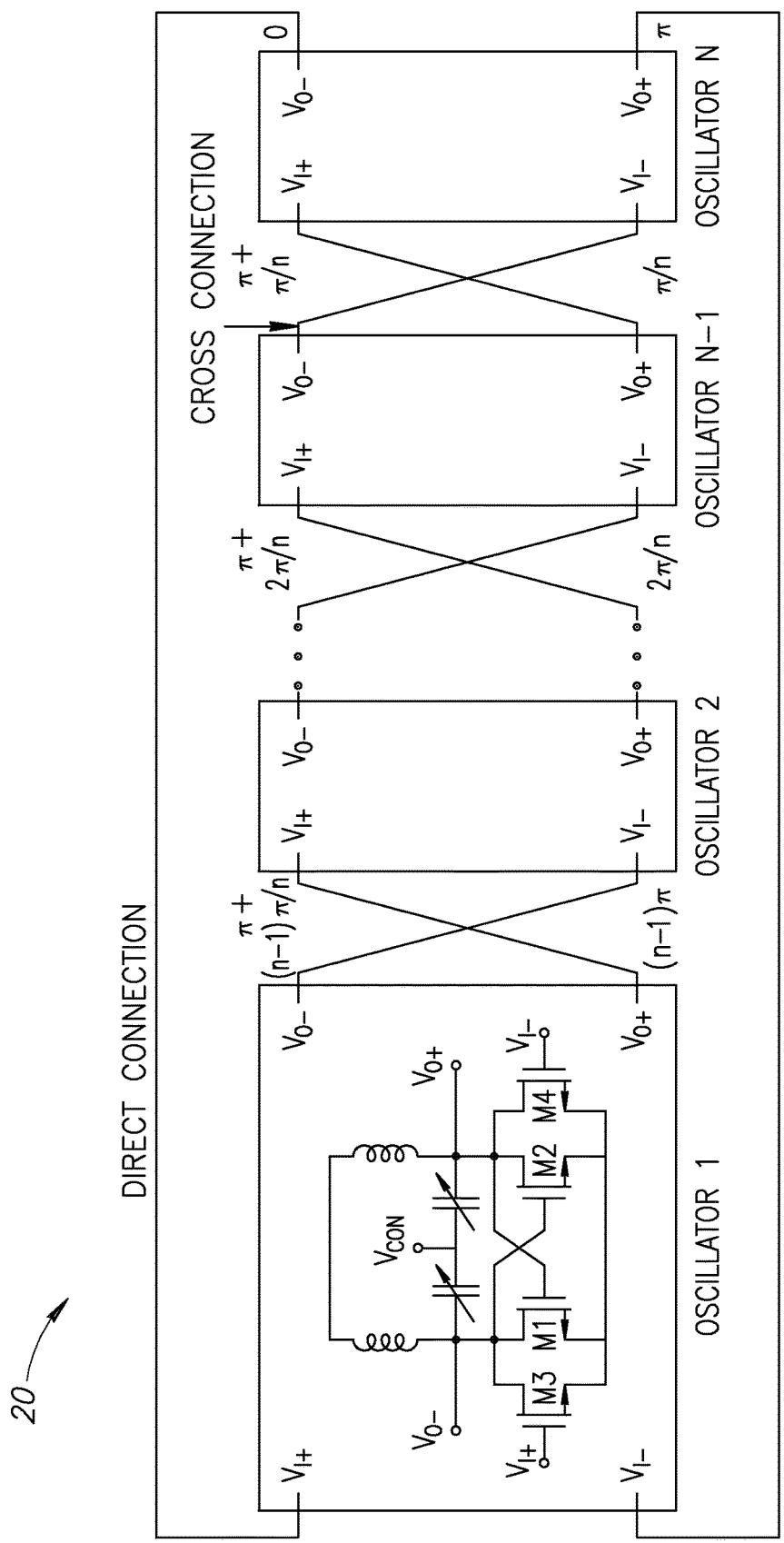
FIG. 2 is a circuit diagram illustrating an example prior art LC type oscillator with an additional number of oscillators.
Figure 3A:
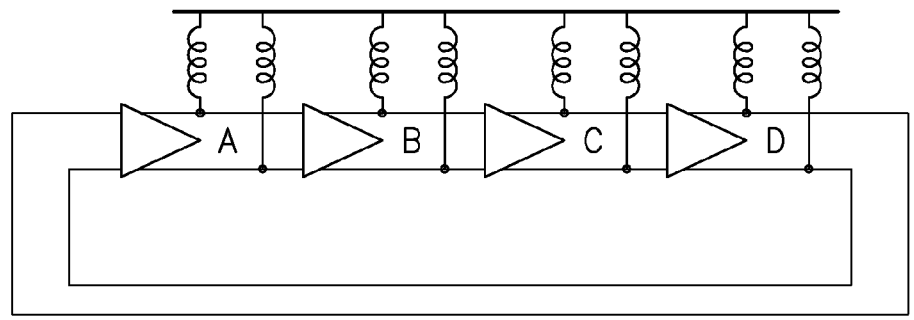
FIG. 3A is a circuit diagram illustrating an example prior art multiphase LC type ring oscillator.
Figure 3B:
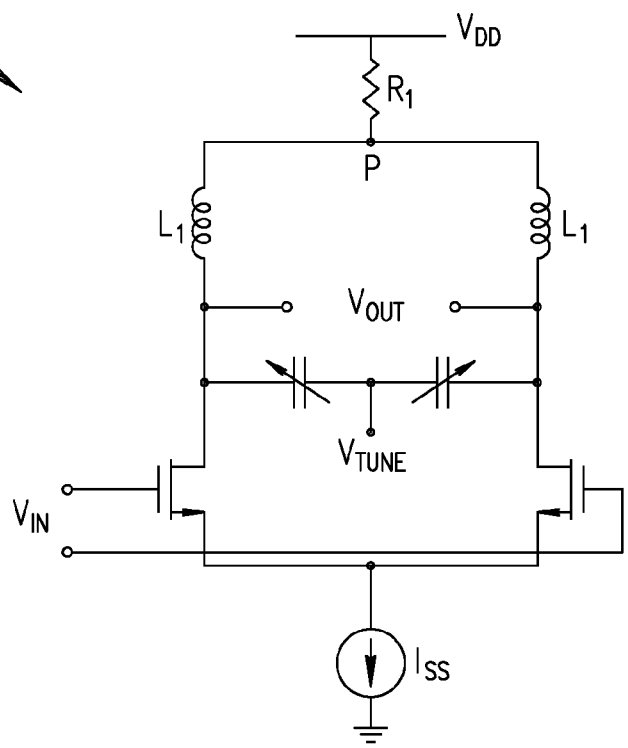
FIG. 3B is a circuit diagram illustrating an example implementation of each stage of the oscillator of FIG. 3A in more detail.
Figure 4:
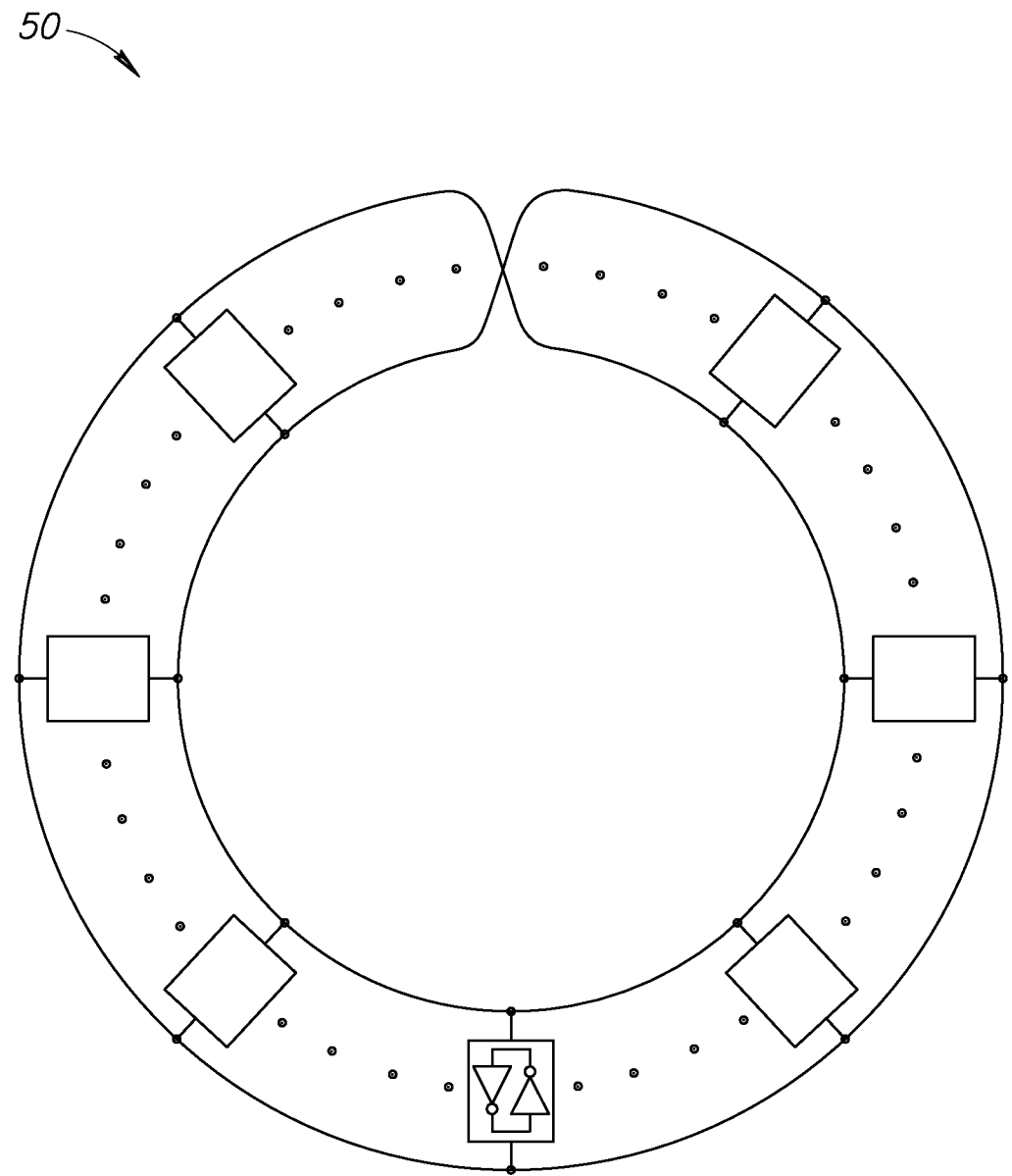
FIG. 4 is a circuit diagram illustrating an example prior art rotary traveling-wave oscillator.
Figure 5A:
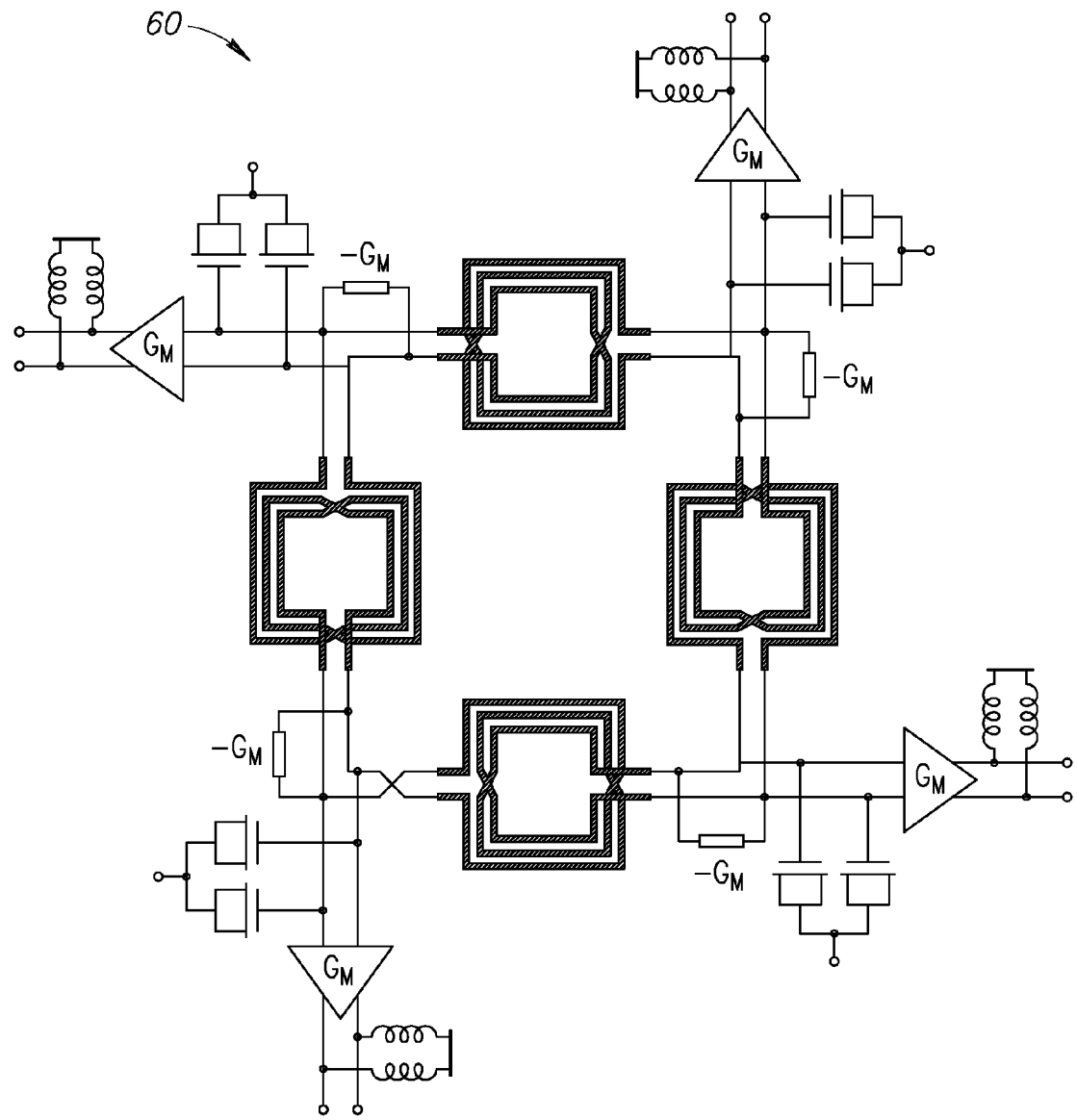
FIG. 5A is a circuit diagram illustrating an example prior art multiphase LC type ring oscillator.
Figure 5B:
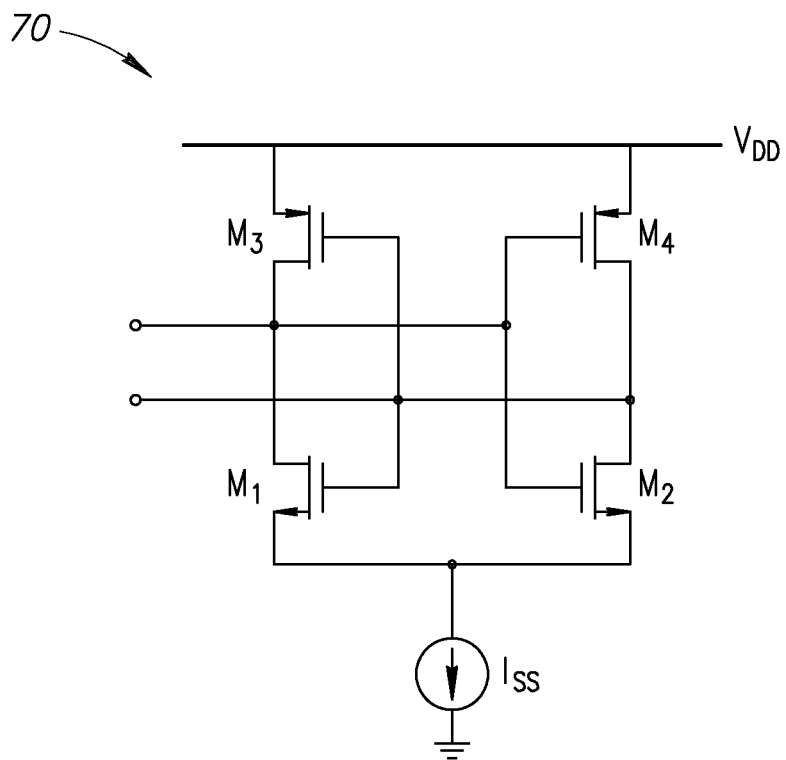
FIG. 5B is a circuit diagram illustrating an example implementation of a negative $G_m$ cell stage of the oscillator of FIG. 5A in more detail.
Figure 6:
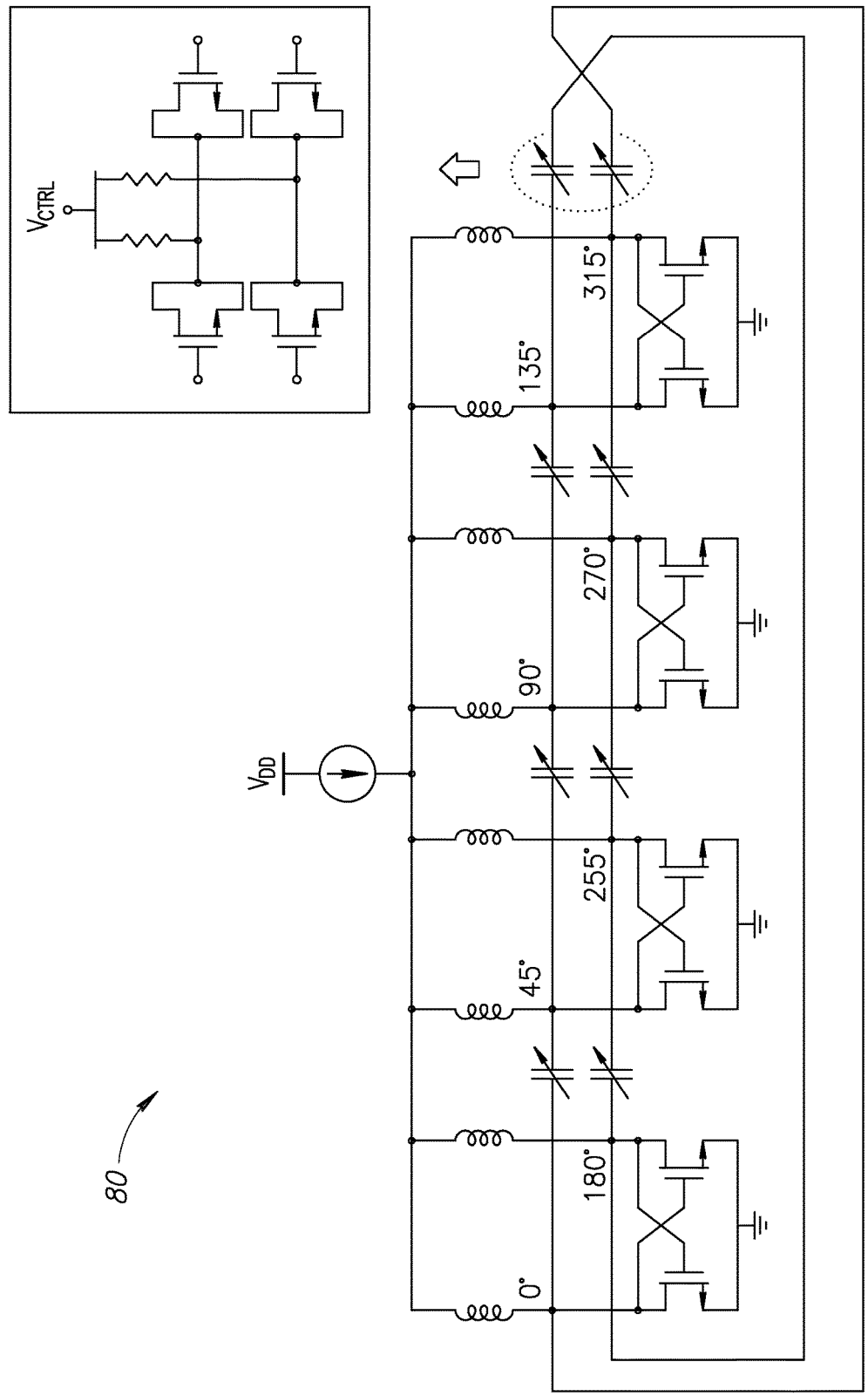
FIG. 6 is a circuit diagram illustrating an example prior art multiphase ring oscillator using a CL ladder configuration.
Figure 7A:
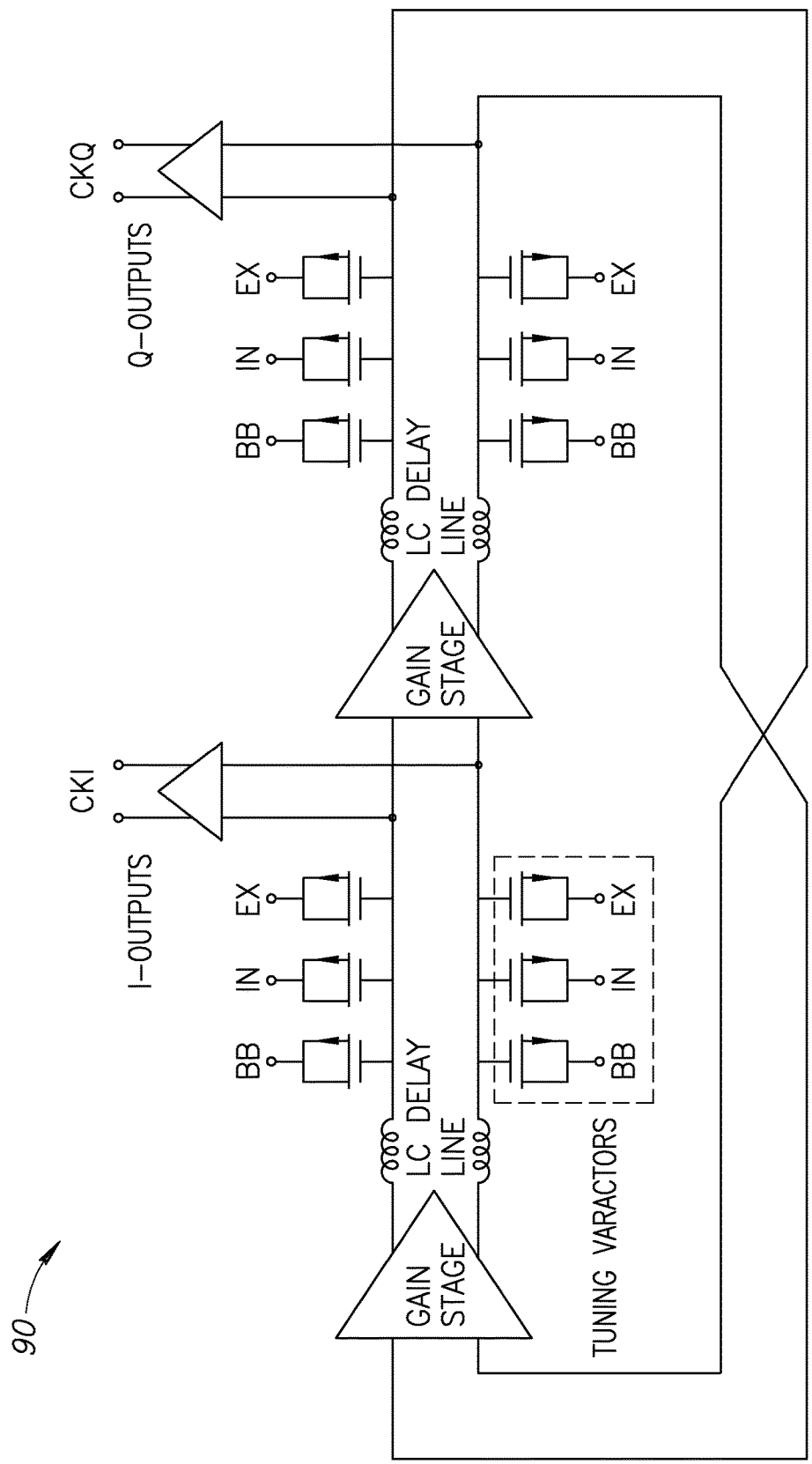
FIG. 7A is a circuit diagram illustrating an example prior art LC delay line oscillator.
Figure 7B:
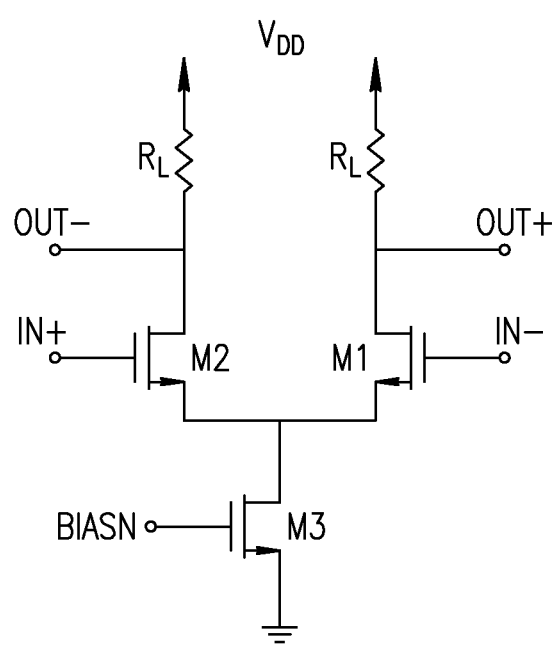
FIG. 7B is a circuit diagram illustrating an example implementation of a gain stage of the oscillator of FIG. 7A in more detail.
Figure 8A:
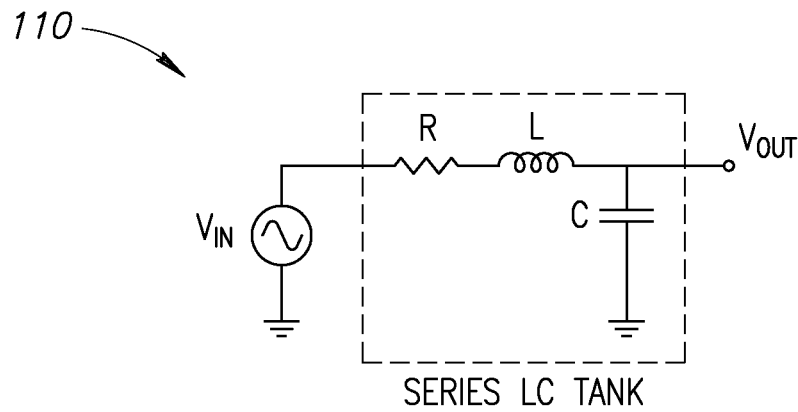
FIG. 8A is a circuit diagram illustrating an example series LC tank used as 90 degree phase shifter.
Figure 8B:
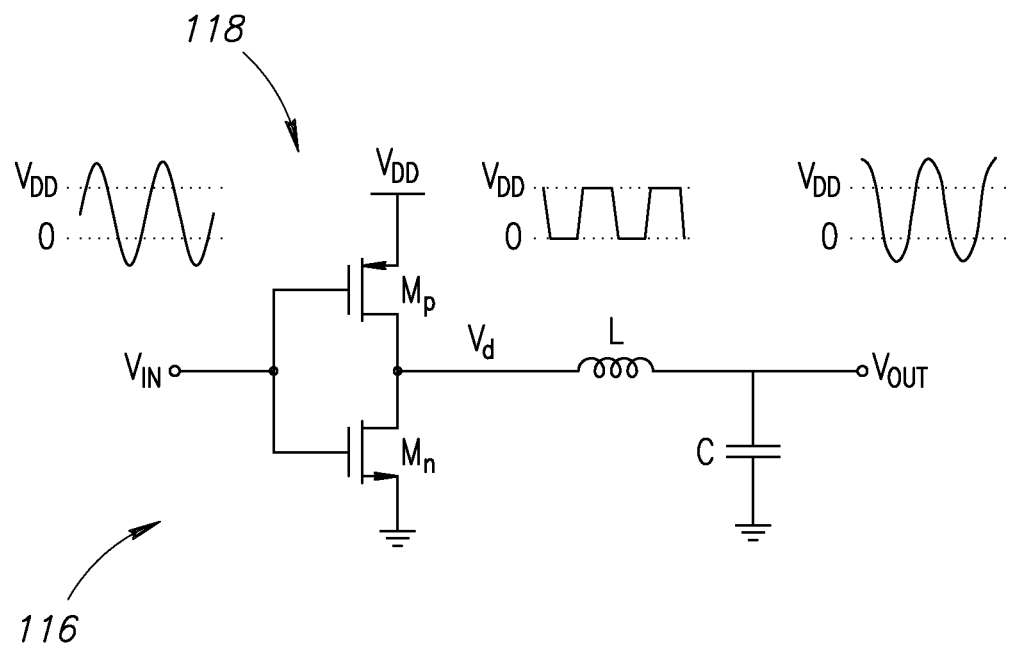
FIG. 8B is a circuit diagram illustrating an example implementation of the driving buffer in the circuit of FIG. 8A in more detail.
Figure 8C:
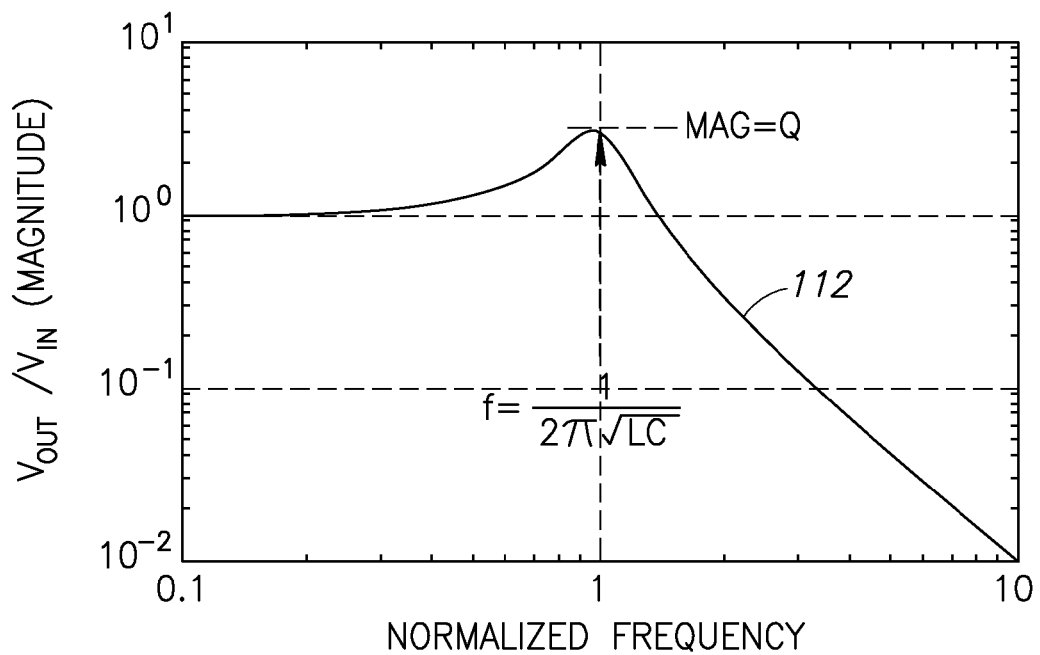
FIG. 8C is a graph illustrating magnitude response versus frequency for the circuit of FIG. 8A.
Figure 8D:
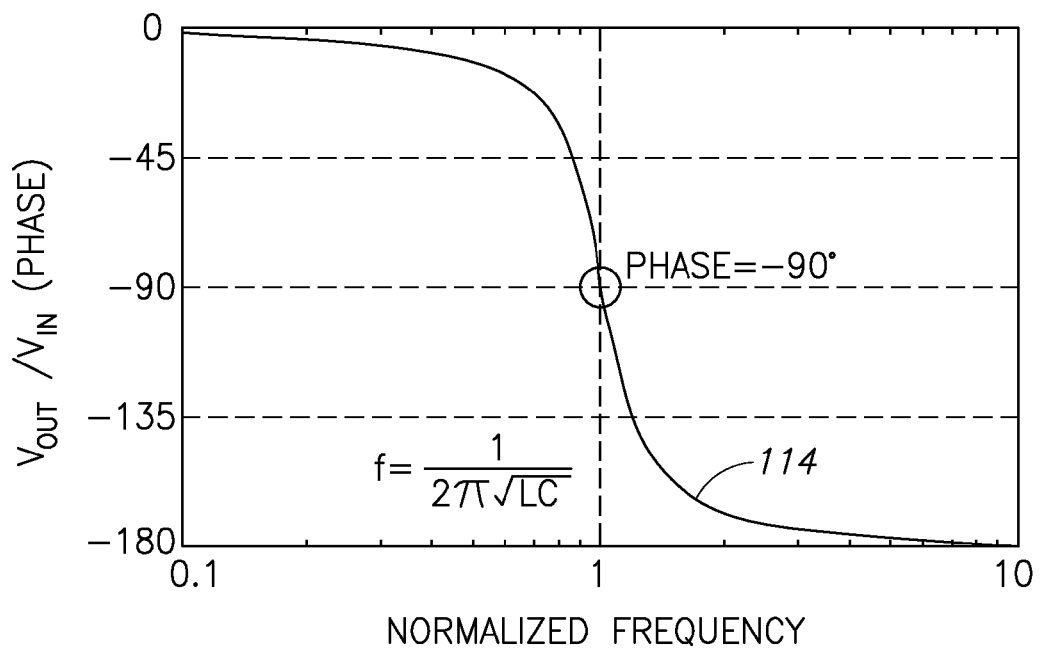
FIG. 8D is a graph illustrating phase response versus frequency for the circuit of FIG. 8A.

A circuit diagram illustrating an example series LC tank used as 90 degree phase shifter is shown in FIG. 8A. A circuit diagram illustrating an example implementation, generally referenced 116, of the driving inverter on the circuit of FIG. 8A in more detail is shown in FIG. 8B. A graph illustrating magnitude response versus frequency for the circuit of FIG. 8A is shown in FIG. 8C. A graph illustrating phase response versus frequency for the circuit of FIG. 8A is shown in FIG. 8D.

With reference to FIG. 8A, a series LC tank, generally referenced 110, is driven by a low impedance source. A Bode plot 112 in FIGS. 8C and 8D shows the output voltage of this LC tank circuit amplified Q times and phase shifted by −90 degrees (see plot 114) at the resonant frequency of the LC tank. To work properly, the tank is preferably driven with a low impedance source. A simple CMOS inverter 118 as a class-D amplifier provides such a low impedance as long as a sufficiently large enough input signal is provided as shown in FIG. 8B. While the input of the inverter is a sinusoidal signal, its output jumps rapidly between 0V and $V_{DD}$ yielding a square wave. The LC tank filters higher harmonics and generates a sinusoidal with total phase shift of +90 degrees with respect to the inverter's input. Putting a plurality of these stages in a loop, e.g., four, a 360 degree phase shift is generated with sufficient gain to satisfy the Barkhausen criterion of oscillation.

In one embodiment, the architecture of the oscillator is based on a 90 degree phase shifter. Using a multiple, e.g., four, of these phase shifters in a loop with the required amplification gain, Barkhausen phase and gain criteria can be satisfied and a quadrature oscillator is formed. The simplest 90 degree phase shifter is a series LC tank. Plots 112 and 114 of FIGS. 8C and 8D, respectively, show the frequency response of this network.

This second-order low-pass filter produces an exact 90 degree phase shift at resonance frequency. Moreover, it has a voltage gain equal to the quality factor (Q) of the tank. To maintain the quality factor of the tank, it is preferably driven with a low impedance voltage source. Also, its output load is preferably a high impedance or capacitive load to be absorbed as part of the tank capacitance.

Figure 9A:
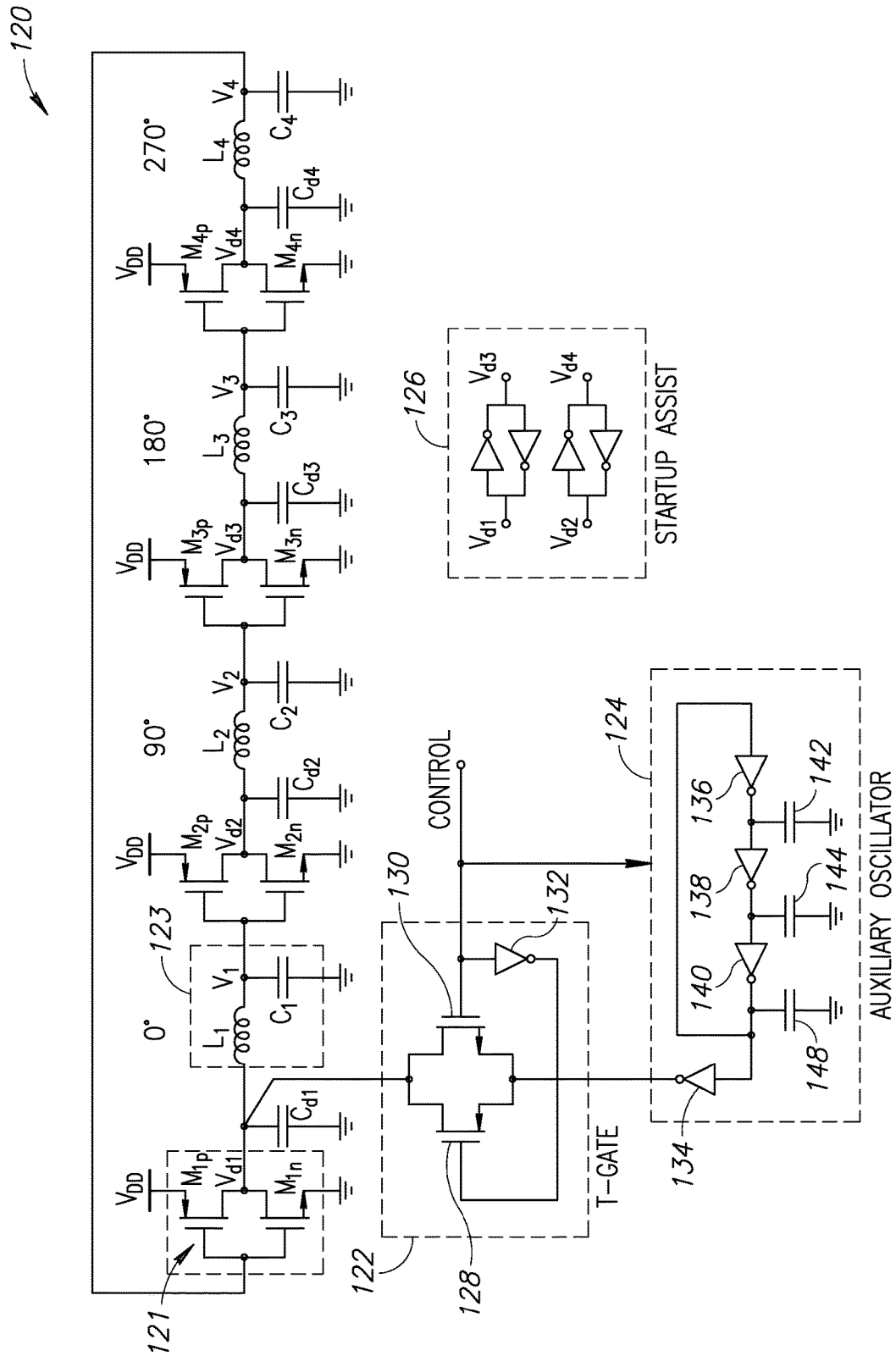
FIG. 9A is a circuit diagram illustrating an example embodiment of the class-D series LC tank ring oscillator with a starting circuit constructed in accordance with the present invention.
Figure 9B:
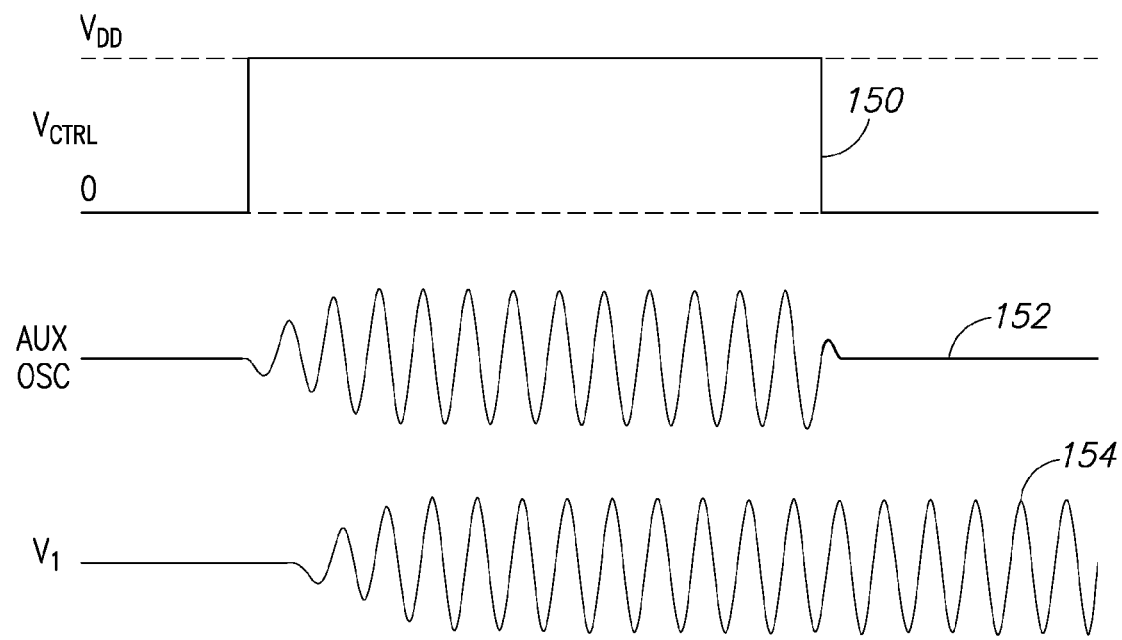
FIG. 9B is a diagram illustrating example waveforms of the circuit of FIG. 9A.
Figure 9C:
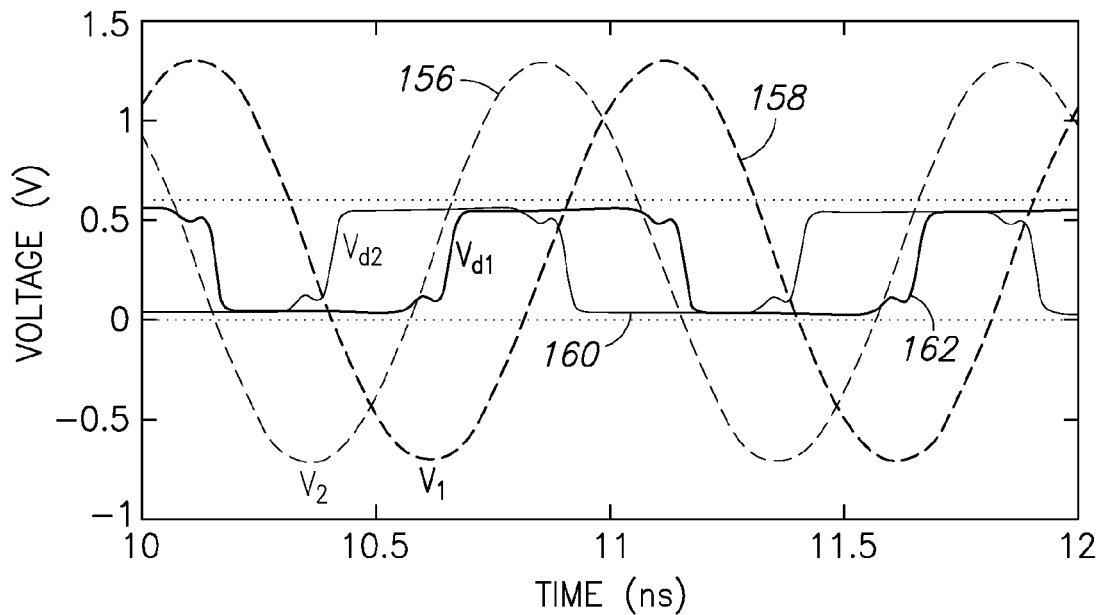
FIG. 9C is a graph illustrating voltage versus time for the circuit of FIG. 9A.
Figure 9D:
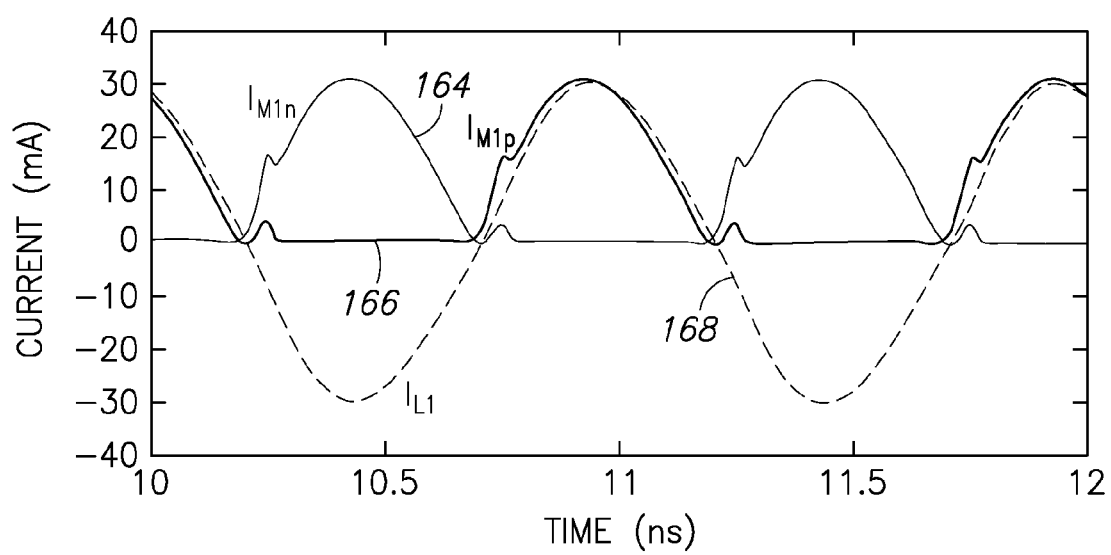
FIG. 9D is a graph illustrating current versus time for the circuit of FIG. 9A.

A circuit diagram illustrating an example embodiment of the class-D series LC tank ring oscillator with a starting circuit constructed in accordance with the present invention is shown in FIG. 9A. A diagram illustrating example waveforms of the circuit of FIG. 9A is shown in FIG. 9B. A graph illustrating voltage versus time for the circuit of FIG. 9A is shown in FIG. 9C. A graph illustrating current versus time for the circuit of FIG. 9A is shown in FIG. 9D.

The core of the oscillator, generally referenced 120, is shown in FIG. 9A. If there is an oscillation in the loop, the core maintains it and creates 0, 90, 180, and 270 degree phases. If the oscillator starts from zero, however, positive DC gain around the loop forces the outputs of the inverters to 0 and $V_{DD}$ (e.g., $V_{d1}=V_{d3}=0$ and $V_{d2}=V_{d4}=V_{DD}$). In this state, the oscillator is locked and the gain of the inverters is around zero. Therefore, unlike in conventional oscillators, noise does not initiate the oscillation build-up. The present invention incorporates a starter circuit operative to generate the initial oscillation in the core. In one embodiment, the starter circuit includes an auxiliary oscillator 124 at a frequency roughly near resonant frequency of the core as well as a T-gate circuit 122 that connects it to the core. At first, the auxiliary oscillator 124 is turned on and connected to the core. After few nanoseconds when oscillation is established in the main core, the auxiliary oscillator is turned off and disconnected. Adding back-to-back inverters 126 between the differential outputs (i.e. $V_{d1,3}/V_{d2,4}$) assists easier startup of the core.

FIG. 9B shows transient waveforms of the oscillator including $V_{ctrl}$ 150, Aux Osc 152 and $V_1$ 154. If the inverters 121 are sized properly, the voltage waveform of their outputs comprises a square wave. Then, each of the transistors conducts when only its drain-source voltage is about zero. In this way the inverters are operated as high-efficiency class-D amplifiers without noticeable degradation of the tank Q-factor.

In one embodiment, the oscillator 120 comprises four series LC tanks 123 and four inverters 121 in a loop. The four LC tanks provide approximately 360 degree phase shift around the loop, with 90 degrees generated by each tank. The required loop gain for oscillation is provided by voltage amplification of the series LC tank in combination with gain of the inverters. The four inverters ensure proper driving of the LC tanks with a low impedance as well as isolating them. In general, active circuits or buffers are used in place of inverters. Furthermore, the capacitive input impedance of the inverter is absorbed by the capacitor of the LC tank. One skilled in the art, however, can implement the buffers in other ways besides inverters to achieve the oscillator of the present invention.

FIGS. 9C and 9D show simulated voltage and current waveforms of the oscillator with $V_{DD}$=0.6V and Q=3, at 1 GHz. Note that it is assumed that the oscillator 120 has proper initial conditions and a stable oscillation. In this state, the inverters have a full swing square wave output ($V_{d1}$-$V_{d4}$) between 0 and $V_{DD}$. The first LC tank filters higher harmonics of its square wave input ($V_{d1}$) 162 resulting in a sine wave output on $V_1$ 158. Since the circuit oscillates at resonance frequency of the tanks, $V_1$ has a −90° phase shift relative to $V_{d1}$. Furthermore, the amplitude of $V_1$ is Q times larger than the first harmonic of $V_{d1}$. Next, $V_1$ drives the subsequent buffer in the chain which converts its sine wave input into an inverted square wave ($V_{d2}$) 160 which results in a sine wave output on $V_2$ 156. This sequence continues in the loop for the subsequent stages.

By having a large enough voltage swing at the input of each inverter and appropriate transistors sizes, the outputs of the inverters are square waves switching rapidly between 0 and $V_{DD}$. In this manner, while each of the NMOS or PMOS transistor is on, its drain to source voltage drop is nearly zero. Therefore, the inverters are operating as very high efficiency class-D amplifiers with very low power loss. Consequently, most of oscillator input power is injected into the LC tanks yielding large oscillation amplitude and low phase noise.

Considering (expediently) buffers as ideal amplifiers with a small-signal negative gain A, the transfer function of the open loop can be written as follows:

$$H(j\omega) = \left(\frac{-A}{1+jRC\omega - LC\omega^2}\right)^4 \quad (1)$$

in which R, L and C are series loss resistance, inductance and capacitance of the tank, respectively. Consequently, the oscillation frequency can be calculated as:

$$\omega_{OSC} = \frac{1}{\sqrt{LC}} \quad (2)$$

which is the same resonance frequency of each individual tank.

Figure 10:
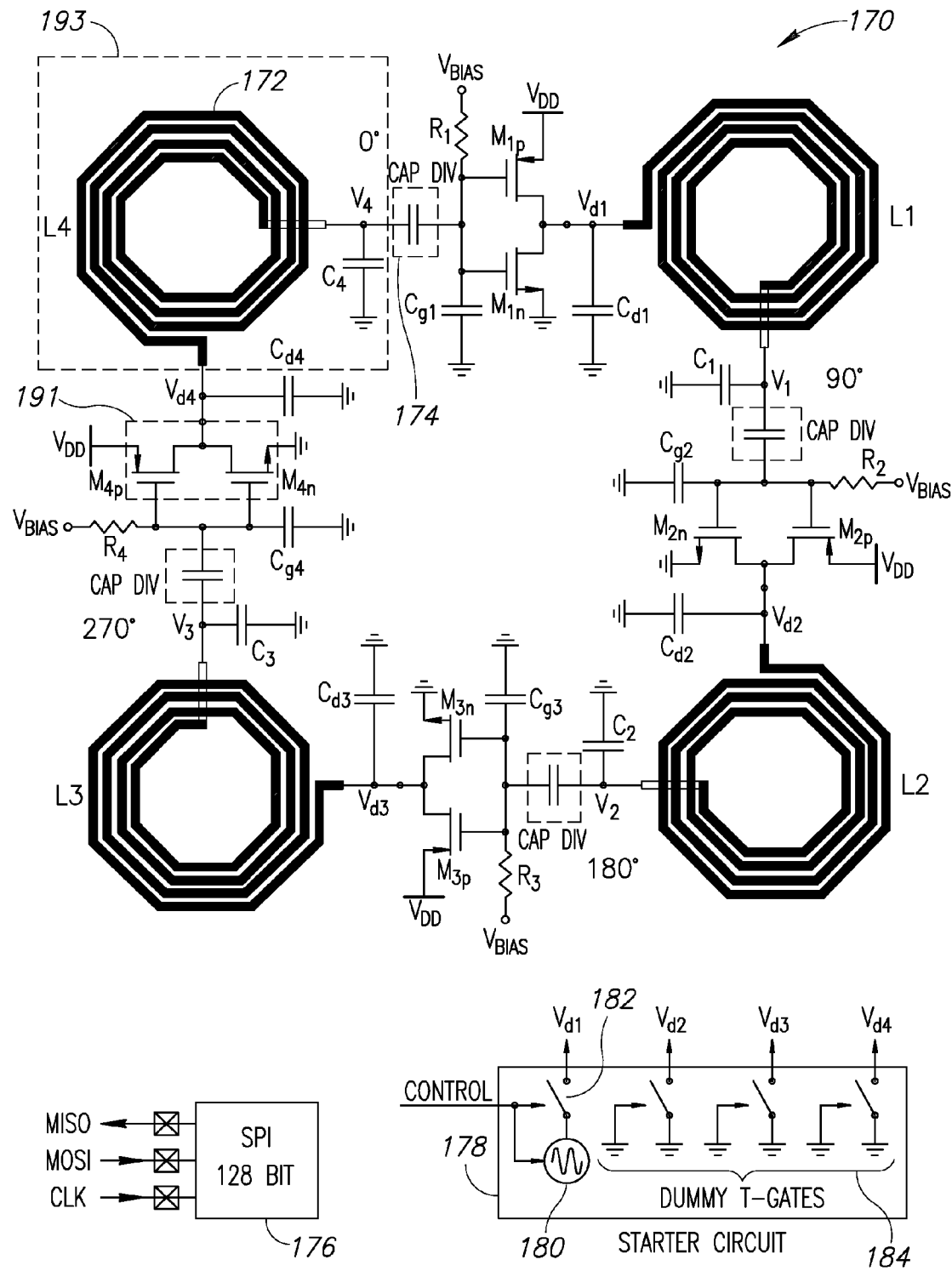
FIG. 10 is a circuit diagram illustrating a second embodiment of the ring oscillator of the present invention.

A circuit diagram illustrating a second embodiment of the ring oscillator of the present invention is shown in FIG. 10. The oscillator, generally referenced 170, comprises a plurality of stages, e.g., four, with each stage comprising a buffer 191 coupled to an LC tank 193. In this example, the buffer comprises an inverter and the LC tank comprises $L_{1-4}$ 172 and $C_{1-4}$. Note that capacitors $C_{g1-4}$ and the parasitics of subsequent inverters can be also considered as part of $C_{1-4}$. The oscillator also comprises starter circuitry 178 and an I/O interface 176 for configuring the capacitor selection which controls the coarse and fine tuning of the frequency of oscillation. The startup circuitry comprises an auxiliary oscillator 180, T-gate 182 and dummy T-gates 184.

In one embodiment, the oscillator 170 utilizes four relatively small inductors to save area. Consequently, the inductors have a very low quality factor of about 1.5 to 2. In another embodiment, the oscillator uses four regular size inductors with Q≈8. Since the series LC tank at resonance has a voltage amplification gain of Q for the first harmonic, its voltage swing can break down the gate oxide of inverters. Therefore, capacitor 174 is placed before each inverter to make a capacitive voltage divider in combination with parasitic capacitance of the inverter. Then, by choosing an appropriate capacitor value, the voltage swing at the input of the inverter is reduced to a value ensuring reliability of the transistors. In this embodiment, the gate of the transistors is biased through $R_{1-4}$ to $V_{bias}$ which comes from a dummy self-biased inverter. In addition to the starter circuit, three dummy switches are placed at the output of the other inverters to keep the four phases balanced.

It is noted that the quadrature oscillator structure can reach a relatively high I/Q accuracy, as the 90 degree phase shifts are inherently generated around the loop. In contrast, prior art QVCOs made by cross coupling two oscillator cores trades off quadrature accuracy with PN. Due to the single ended implementation of the oscillator of the present invention, no layout asymmetry is created that would otherwise degrade I/Q accuracy. To measure the oscillator quadrature accuracy, four quadrature baseband signals are upconverted by the oscillator quadrature signals around the carrier. Image rejection ratio (IMRR) of the upconverted signal reflects the quadrature accuracy of the oscillator. The image rejection ratio (IMRR) is measured for the high-performance (HP) version of the oscillator across the tuning range. In one example, IMRR ranges from 45 to 60 dB for the HP version and from 35 to 47 dB for the LA version, considering worst case out of 5 IC samples each.

Note that the preferred way to tune the frequency of oscillation is by changing the capacitances in series with the inductors. In the LA version, $C_{1-4}$ (FIG. 11) is tunable by 5 bits of 12 fF steps, covering an octave (66%) tuning range from 2.82 to 5.61 GHz. In the HP version, coarse tuning banks $C_{1-4}$ (FIG. 10) are tunable by 4 bits of 20 fF steps. This covers a tuning of 26% from 1.85 to 2.4 GHz. In addition to these banks, four fine tuning banks are added ($C_{g1-g4}$ in FIG. 10). Each of these capacitor banks are 7 bits with an ultralow step size of 100 aF. This gives a frequency resolution of 20 kHz in 500 steps (≈4×$2^7$ levels), when fine tuning banks are controlled separately.

To achieve further ultrafine tuning steps, capacitor banks $C_{d1-d4}$ (FIG. 10) can be placed at the inverter outputs. Any capacitance at the output of each inverter introduces a small delay inversely proportional to the large-signal $G_m$ of the inverter. As the inverters are very strong to be able to drive the LC tanks, the capacitance effect at the output of inverters in much smaller than its effect when it is paralleled with $C_{1-4}$. Placing the same fine tuning banks at the output of inverters ($C_{d1-d4}$ in FIG. 10) improves the frequency resolution down to 1.27 kHz, i.e. a 16× reduction in this example implementation.

Thus, the tank capacitor bank $C_{1-4}$ provides relatively coarse frequency tuning of the oscillator. Capacitor bank $C_{g1-4}$ connected to the input of the buffers provides somewhat finer tuning resolution. Capacitors $C_{d1-4}$ connected to the output of the buffers, however, provide extremely fine tuning, e.g., 1.27 kHz. This capacitor bank at the drains of the buffers, however, has much less effect than the capacitor bank connected to the gate of the buffers and is able to achieve much finer resolution.

Differential nonlinearity (DNL) and integral nonlinearity (INL) of the oscillator ranges from −0.9/+0.95 and −0.86/+1 LSB, respectively. Considering the achieved DNL/INL, the frequency resolution of 1.27 kHz is extremely high. The PN and figure of merit (FoM) of the high performance oscillator versus supply voltage are also relatively good. The oscillator shows an FoM of 186.5 to 187 dB across its tuning range when $V_{DD}$ is 0.8V. As $V_{DD}$ goes down, voltage amplitude at the inputs of the inverters are reduced and thus output impedance of the inverters are increased. This gradually degrades the tank quality factor and results in a lower FoM. Flicker noise of this oscillator ranges from 200 kHz to 300 kHz. The low area (LA) version oscillator, exhibits an FoM of 167.5 to 176.7 dB across its tuning range. When the oscillator is running at 5.6 GHz, the inductors have a slightly higher Q. $V_{DD}$ is reduced from a typical 1.1V to 0.85V. Note that in both LA and HP implementations of the oscillator, the four inductors $L_{1-4}$ are placed in a substantially symmetric manner. Since the currents of each two succeeding inductors have a 90 degree phase shift, the total magnetic field rapidly becomes zero as we move away from the oscillator core. This effect specifically reduces magnetic coupling of this structure with other blocks in the same die.

Figure 11:
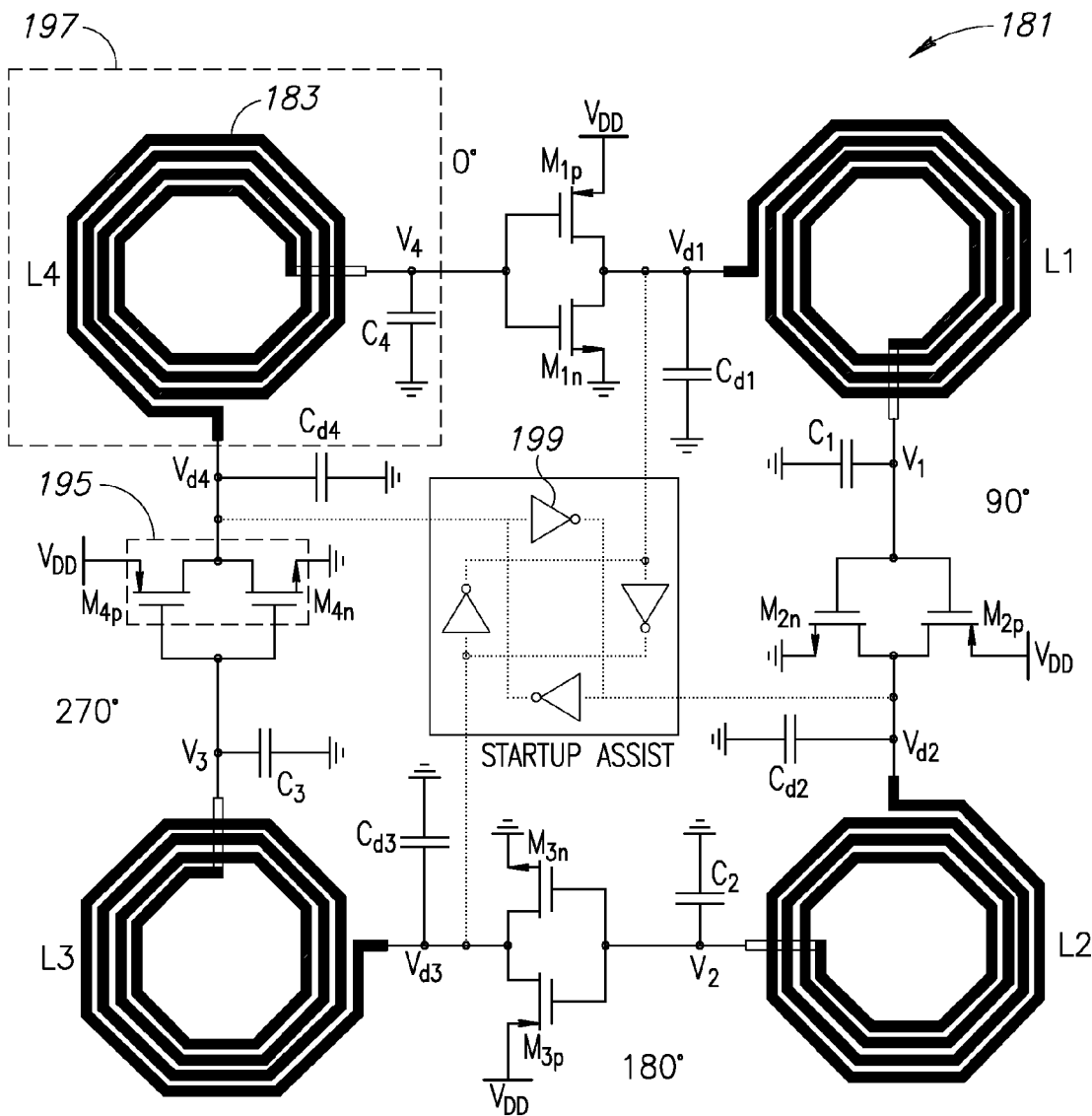
FIG. 11 is a circuit diagram illustrating a third embodiment of the ring oscillator of the present invention.
Figure 11:
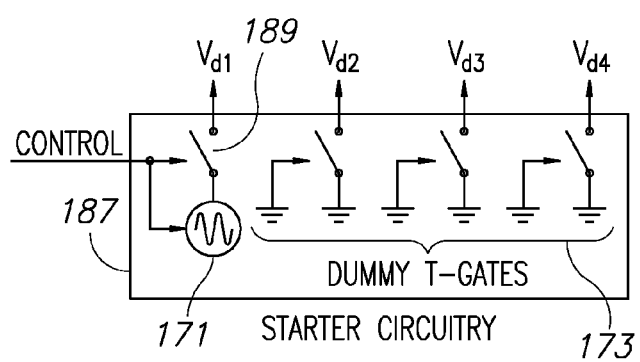

A circuit diagram illustrating a third embodiment of the ring oscillator of the present invention is shown in FIG. 11. The oscillator, generally referenced 181, comprises a plurality of stages, e.g., four, with each stage comprising a buffer 195 coupled to an LC tank 197. In this example, the buffer comprises an inverter and the LC tank comprises $L_{1-4}$ 183 and $C_{1-4}$. The oscillator also comprises starter circuitry 187 and an I/O interface 185 for configuring the capacitor selection which controls the coarse and fine tuning of the frequency of oscillation. The startup circuitry comprises an auxiliary oscillator 171, T-gate 189 and dummy T-gates 173. The oscillator also comprises back to back inverter gates 199 similar to the back to back inverters 126 of FIG. 9A. The inverters 199 are coupled to the nodes $V_{d1-d4}$ and are operative to assist in startup, for example in the low area (LA) version of the oscillator. The operation of the oscillator 181 is similar to that of oscillator 170 of FIG. 10 and will not be repeated here.

Figure 12A:
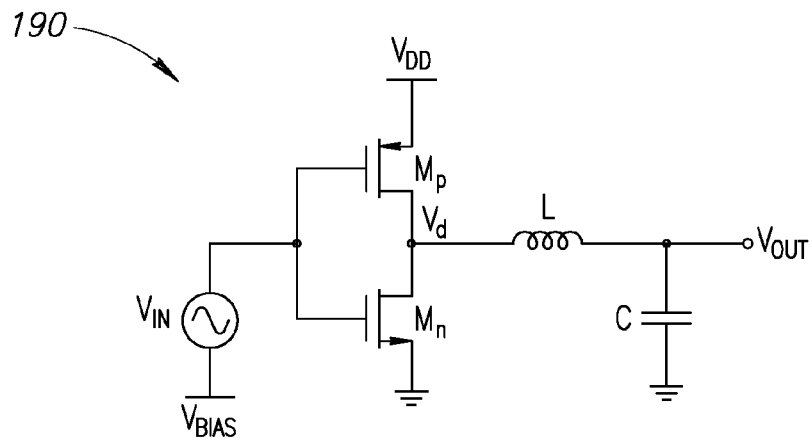
FIG. 12A is a circuit diagram illustrating one of the stages of the ring oscillator in more detail.
Figure 12B:
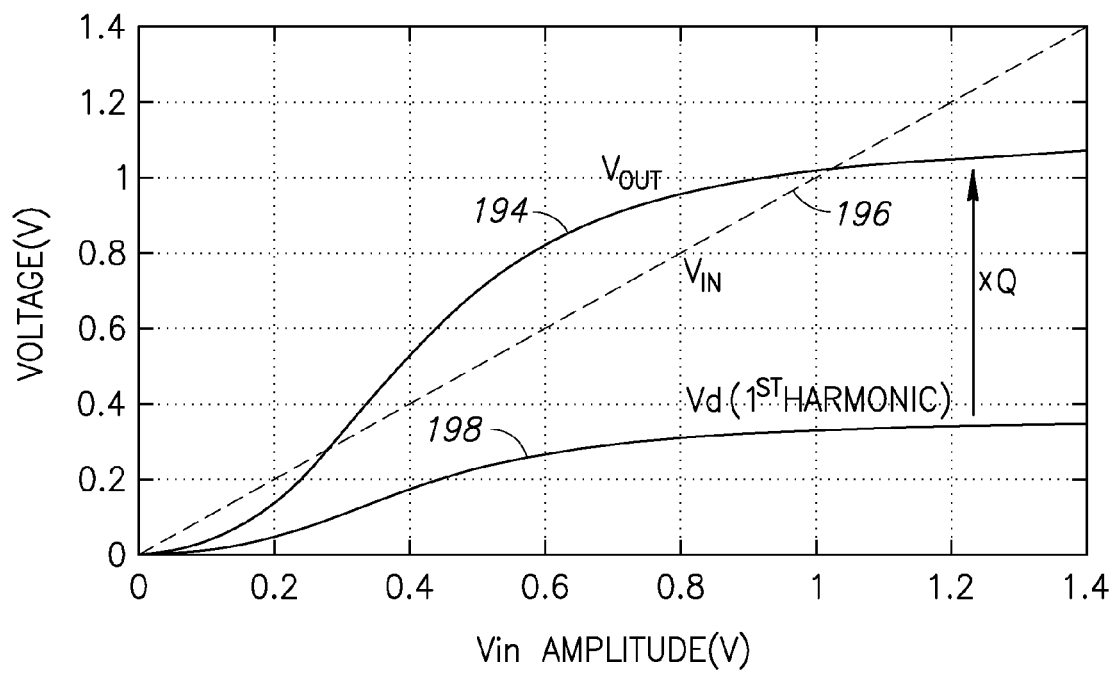
FIG. 12B is a graph illustrating output versus input amplitude of one of the stages of the ring oscillator.

A circuit diagram illustrating one of the stages of the ring oscillator in more detail is shown in FIG. 12A. A graph illustrating output versus input amplitude of one of the stages, generally referenced 190, of the ring oscillator for $V_{DD}=0.6V$ and Q=3, at 1 GHz is shown in FIG. 12B. To satisfy the loop gain criteria, each of four stages preferably has a gain of 1 in the steady state. Since the quality factor of the tank is usually more than unity, the absolute large signal gain of the buffers are less than unity. In fact, they act as limiters switching between 0 and $V_{DD}$ in steady state operation. Hence, these transistors should be large enough to switch the tanks completely.

FIG. 12B shows the output oscillation amplitude 194 of one of the stages versus the input sine wave amplitude 196. The input bias voltage of this stage is tuned to be the same as the output voltage. As the input amplitude increases, amplitude of $V_d$ 198 increases as well. Since the input frequency is the same as the resonant frequency of the LC tank, $V_{out}$ is Q times larger than the first harmonic of $V_d$. For large input amplitudes, $V_d$ is saturated between 0 and $V_{DD}$. Therefore, the large signal gain from $V_{in}$ to $V_d$ is less than one. If the LC tank has a high enough quality factor, large signal gain from $V_{in}$ to $V_{out}$ can be higher than one. Then, the oscillator loop can have a stable oscillation. The point where the amplitude of $V_{out}$ and the input amplitude are equal with a curve slope of less than unity is the stable output oscillation amplitude (≈1.02V in this plot, see traces 194 and 196).

Figure 13:
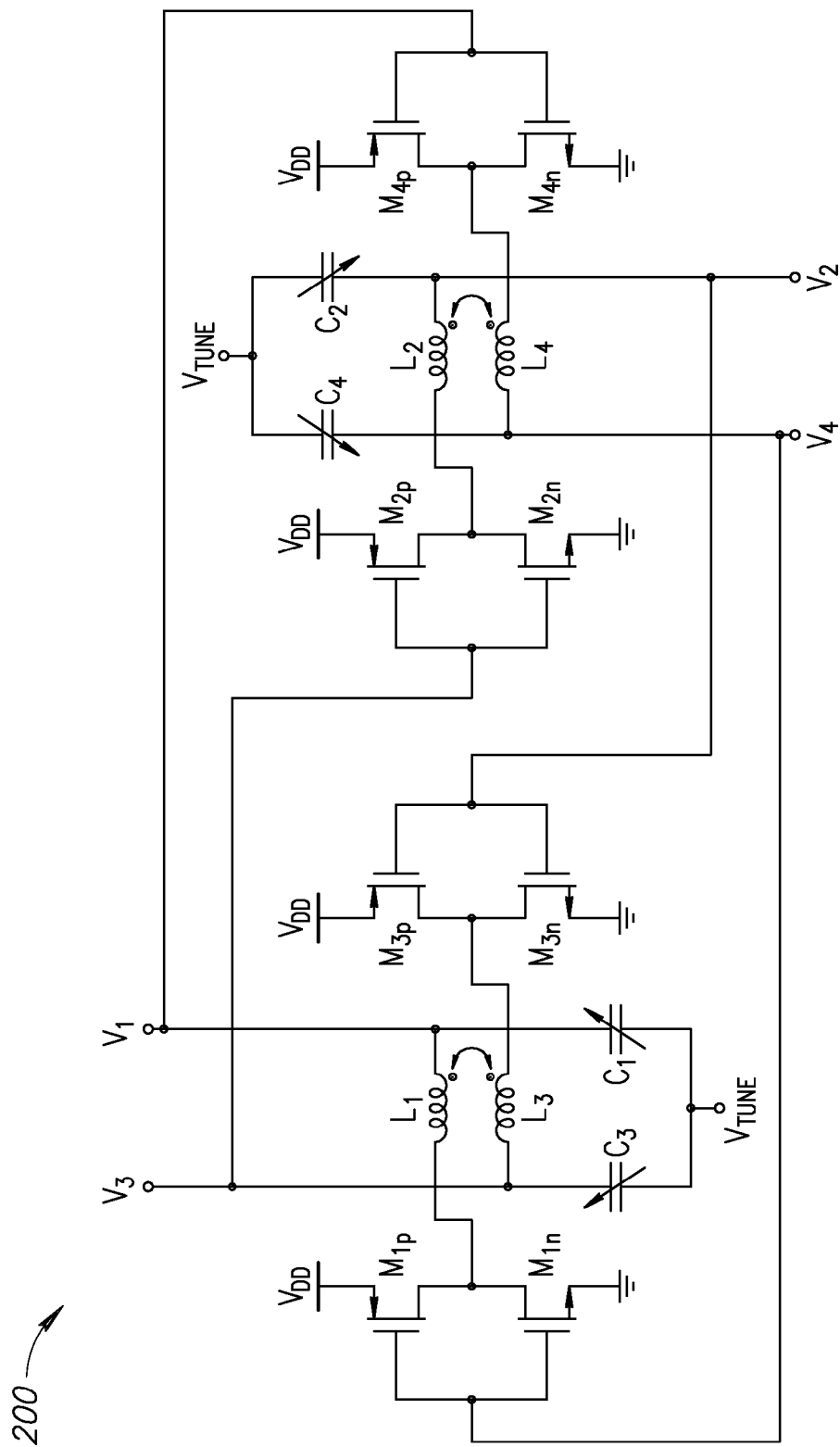
FIG. 13 is a circuit diagram illustrating a fourth embodiment of the ring oscillator of the present invention having mutual coupling between inductors.

A circuit diagram illustrating a fourth embodiment of the ring oscillator of the present invention having mutual coupling between inductors is shown in FIG. 13. In this circuit, generally referenced 200, $L_1$ and $L_3$ as well as $L_2$ and $L_4$ are magnetically coupled to act as transformers. Relatively low Q inductors are used where each coupled L is 180 degrees out of phase. Otherwise, the operation of the circuit is similar to that of the oscillator of FIGS. 10 and 11.

Figure 14:
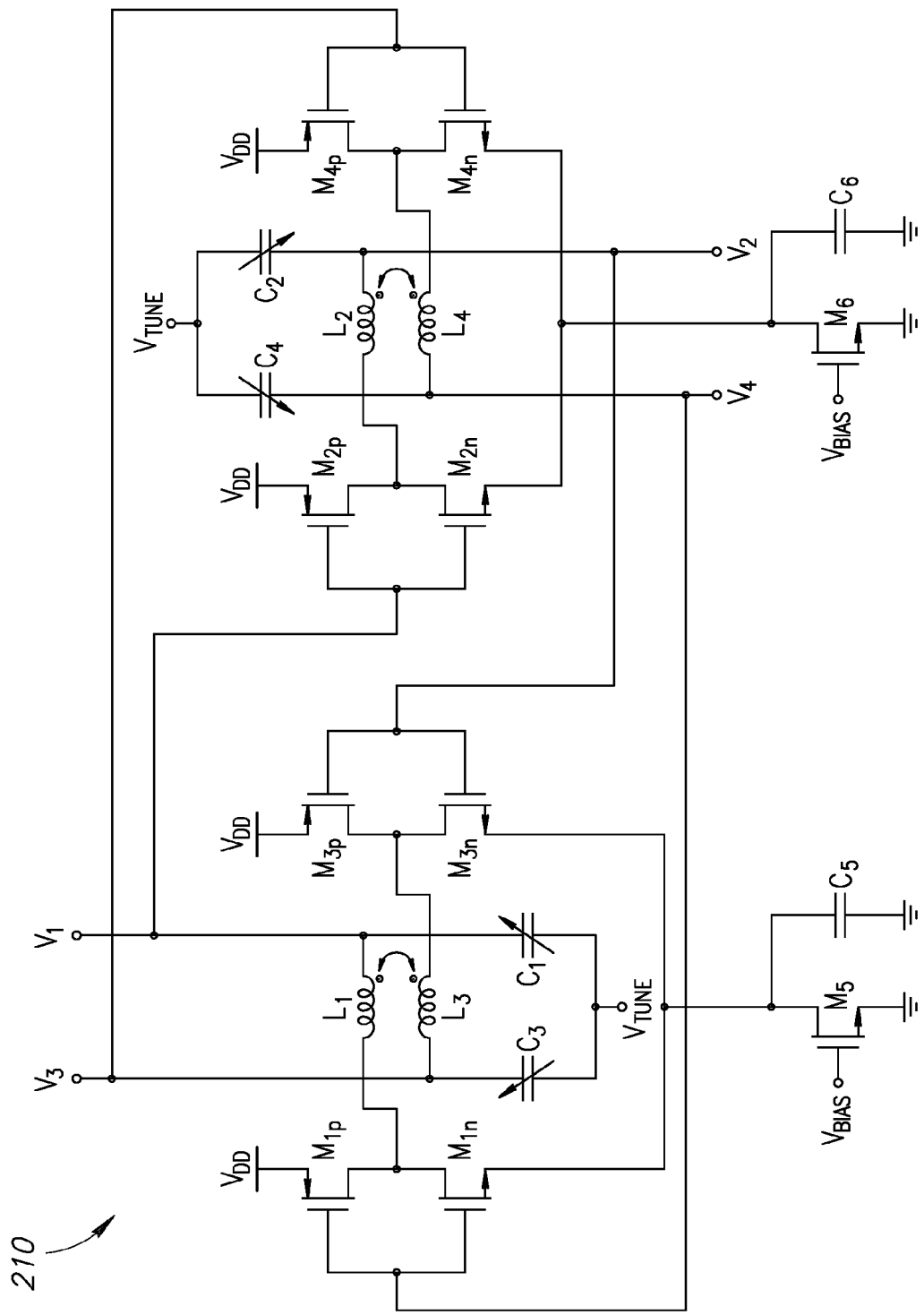
FIG. 14 is a circuit diagram illustrating a fifth embodiment of the ring oscillator of the present invention having a differential configuration with tail current sources.

A circuit diagram illustrating a fifth embodiment of the ring oscillator of the present invention having a differential configuration with tail current sources is shown in FIG. 14. The circuit, generally referenced 210, represents a differential embodiment with tail current sources (i.e. $M_5$ and $M_6$). To maintain class-D operation of the amplifiers, relatively large capacitors (i.e. $C_5$ and $C_6$) are connected in parallel with the current sources to make tail nodes AC ground. Using the current sources, the oscillation amplitude as well as current consumption of the oscillator can be controlled.

Figure 15:
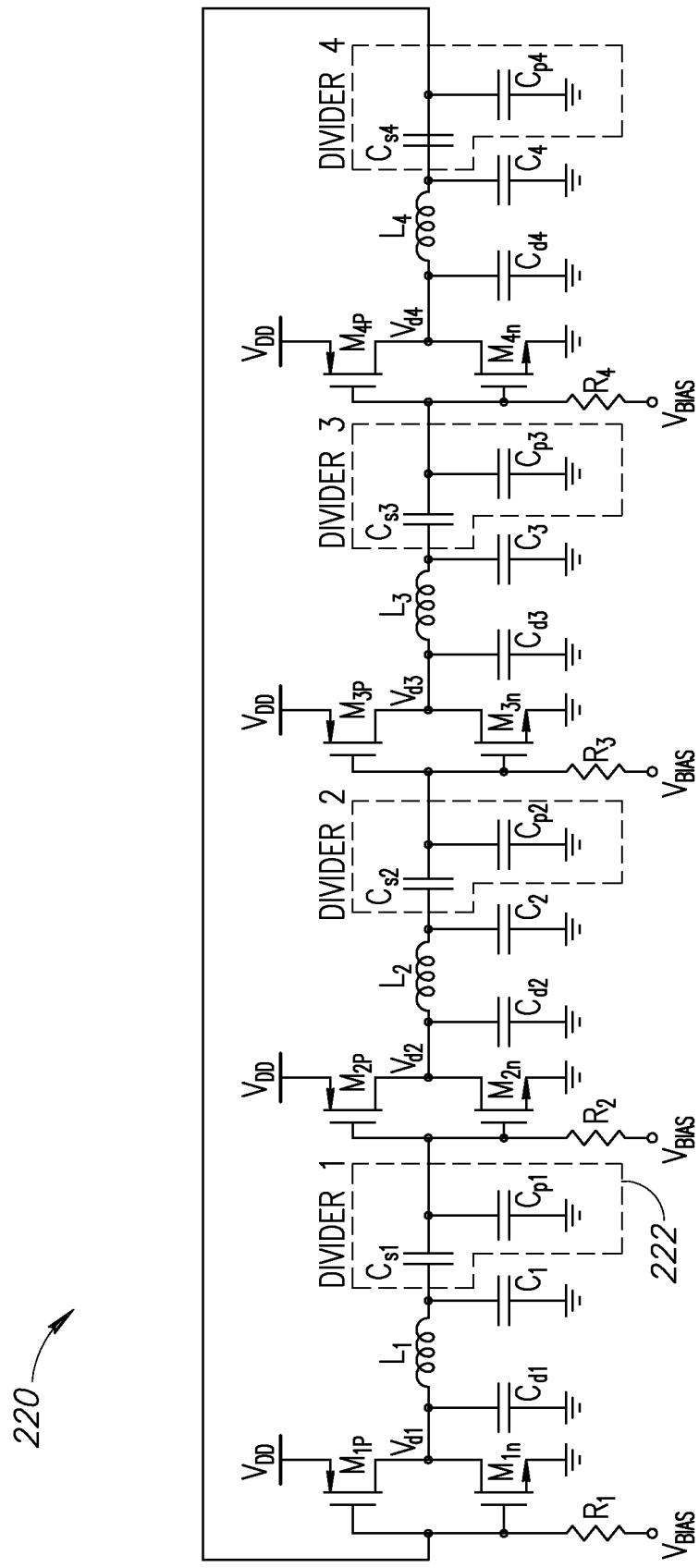
FIG. 15 is a circuit diagram illustrating a sixth embodiment of the ring oscillator of the present invention incorporating capacitive voltage dividers.

A circuit diagram illustrating a sixth embodiment of the ring oscillator of the present invention incorporating capacitive voltage dividers is shown in FIG. 15. In this circuit, generally referenced 220, capacitive voltage dividers 222 are used before each transistor stage. When a high quality factor LC tank is used, the voltage swing at the output of each LC can be several times higher than $V_{DD}$, damaging the transistors. Using the voltage dividers, this voltage is scaled down to an acceptable range for the transistors. The voltage dividers comprise capacitors $C_{s1-4}$ and $C_{p1-4}$. Bias resistors $R_1$-$R_4$ are required to provide the DC bias voltage for the transistors. Note that the operation of this embodiment is similar to that of the oscillator 170 of FIG. 10.

In one embodiment, the transistors of the oscillator stages are preferably sized large enough to have a small output resistance. Even though a specific amplitude can be found in which the loop has a large signal gain of more than one, this the oscillator of the present invention does not inherently tend to oscillate at startup. The reason for this is explained as follows. First consider a conventional three stage inverter based ring oscillator. In this case, the loop has a negative feedback at DC frequency. This means that all outputs remain in a metastable DC point before oscillation startup. Intrinsic noise of this three stage oscillator may find a loop gain of more than unity with zero degree phase shift at a certain frequency which causes the oscillation to build up. The noise can cause startup only in oscillators in which both amplitude and phase criteria are satisfied in small signal around the DC bias point of the circuit.

In the case of one embodiment of the oscillator of the present invention, there are four inverting stages in contrast to the previous case with three inverters. Thus, there is a positive feedback loop at DC frequency (i.e. with shorted inductors and open capacitors at this frequency) which forces the outputs of two stages to stay high and the outputs of the other two stages to stay low. Considering the example oscillator 120 of FIG. 9A, $V_{d1}$ and $V_{d3}$ might remain at $V_{DD}$ and $V_{d2}$ and $V_{d4}$ to ground, or vice versa. Therefore, the drain current of all the transistors will be zero disregarding leakage currents. In this lock state, although the noise may find phase shift criterion at a certain frequency, the small signal gain is quite low. Thus, the noise is not capable of gaining enough amplification to increase and make oscillation around the loop at startup. Although the lock state does not occur when the capacitor divider is present, e.g., in FIG. 10, each stage might not have sufficient signal gain for startup. As shown in FIG. 12B, the gain of each stage could be less than unity for small signals, while it could increase to more than unity for a large input signal (see traces 194 and 196).

Figure 16:
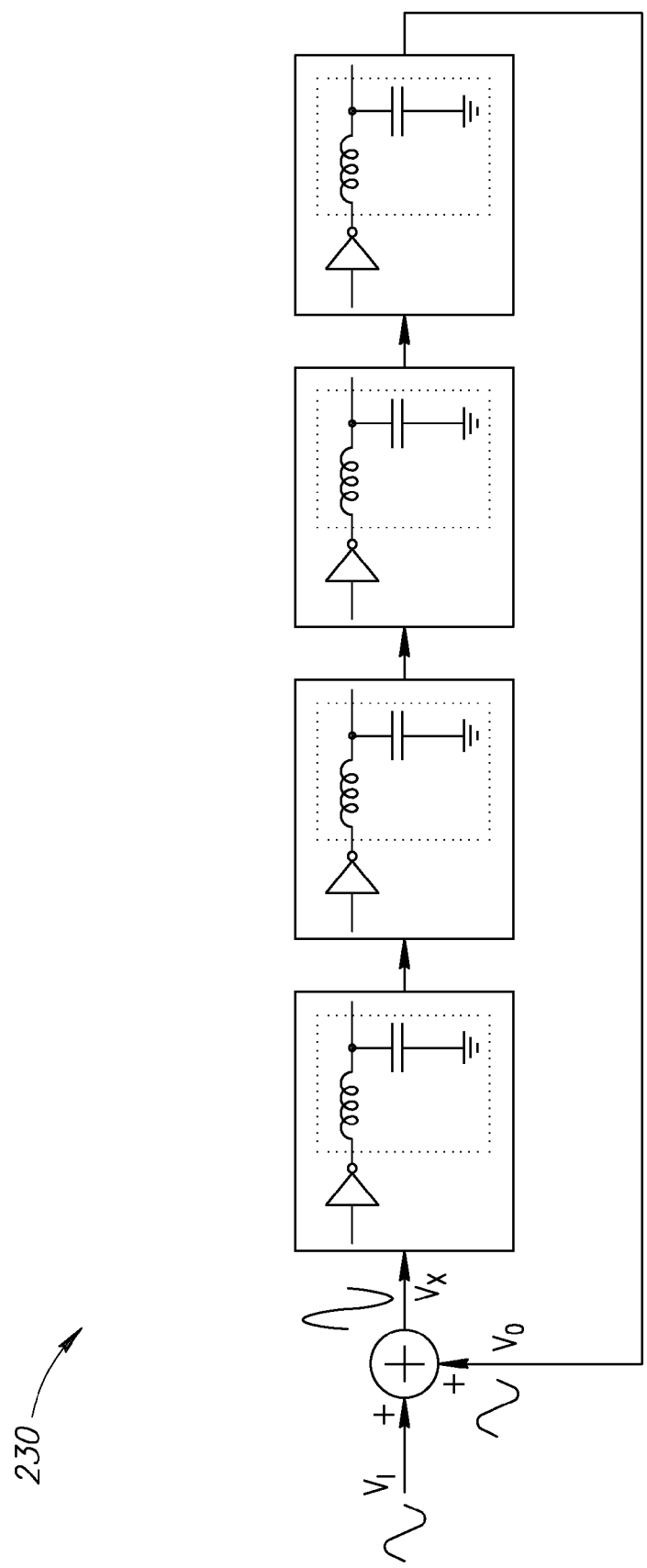
FIG. 16 is a circuit diagram illustrating an example feedback system of the ring oscillator of the present invention.

A circuit diagram illustrating an example feedback system of the ring oscillator of the present invention is shown in FIG. 16. In this Figure, the oscillator is shown as a feedback system, generally referenced 230. As described supra, a small input signal ($V_i$) e.g., noise, cannot remove the oscillator lock state at startup. Hence, a large disturbance on $V_i$ is needed to pull the oscillator out of the lock state. Consider a high swing sinusoidal signal on $V_i$. This signal can switch the first buffer in the loop on and off. Consequently, the output of the first stage can switch subsequent stages respectively. Finally, the output signal ($V_o$) is fed back to the input and causes further switching in the loop. At this time, the lock state is broken down and $V_i$ can be removed. If the propagated disturbance signal in the loop can find enough gain, it builds up and the oscillation stabilizes.

Figure 17A:
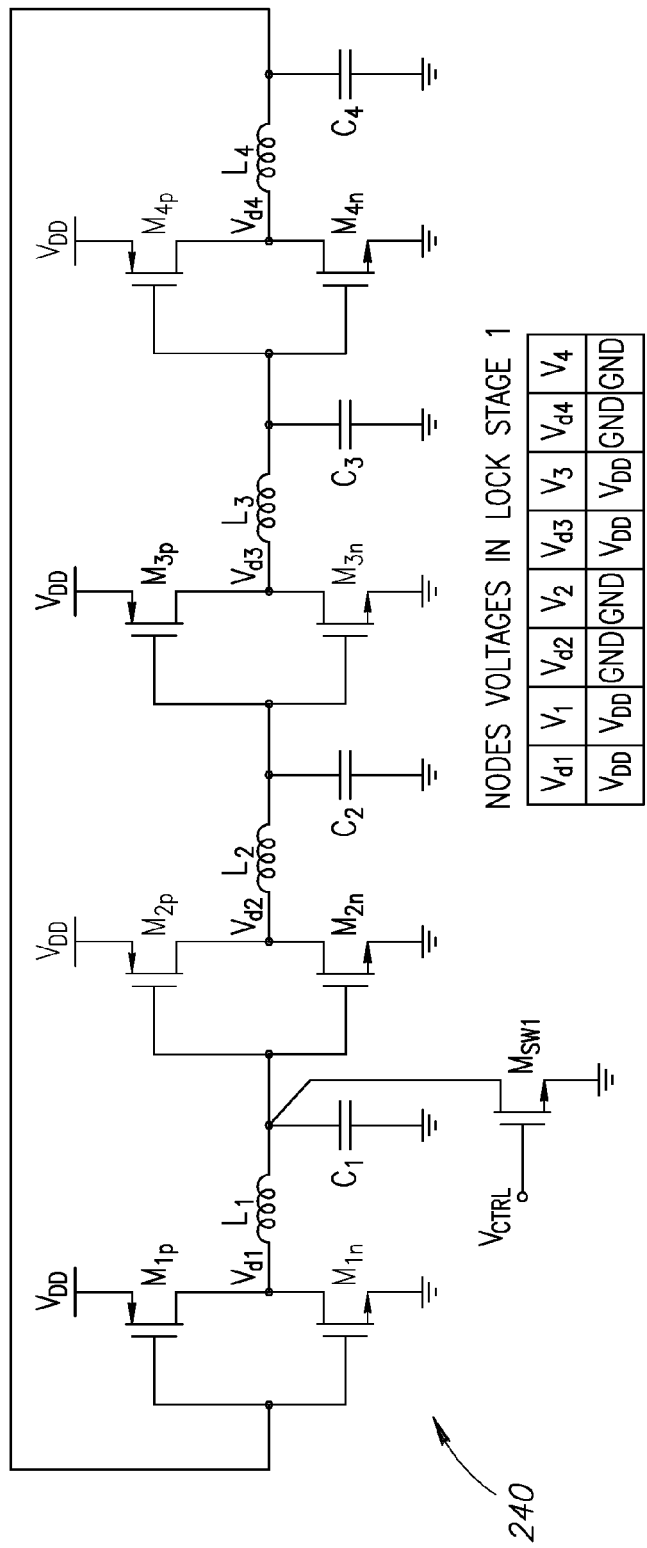
FIG. 17A is a circuit diagram illustrating a seventh embodiment of the ring oscillator of the present invention incorporating a startup circuit that injects a short pulse to the oscillator loop.
Figure 17B:
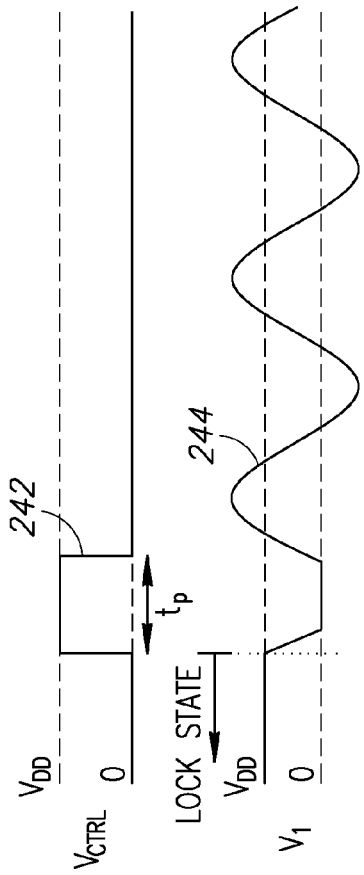
FIG. 17B is a diagram illustrating example waveforms of the circuit of FIG. 17A.

A circuit diagram illustrating a seventh embodiment of the ring oscillator of the present invention incorporating a startup circuit that injects a short pulse to the oscillator loop is shown in FIG. 17A. A diagram illustrating example waveforms of the circuit of FIG. 17A is shown in FIG. 17B. In this circuit, generally referenced 240, a short input pulse can be injected to the loop to launch oscillation. The shape of the input pulse is optimized to find the input signal which creates the largest output amplitude on $V_o$ at the end of the first cycle. For example, a one cycle sine wave signal with a period equal to the period of the oscillator can produce a higher amplitude than the same input with a (much) shorter period. The input disturbance signal with optimum shaping may not be practical to implement. A practical implementable signal shape is a single square pulse 242 which when injected into the loop results in $V_1$ 244 shown in FIG. 17B.

First, consider lock state 1 in which $M_{1p}$, $M_{2n}$, $M_{3p}$, and $M_{4n}$ are on and the other transistors are off. In lock state 2, $M_{1n}$, $M_{2p}$, $M_{3n}$, and $M_{4p}$ are on and the other transistors are off. Connecting $V_1$ to ground by $M_{sw1}$ causes two events to happen: (1) the input disturbance signal changes the state of $V_{d2}$ and consequently a sinusoidal wave propagates through the loop; and (2) $L_1$ is charged through $M_{sw1}$ and $M_{1p}$ while $V_4$ is maintains its initial state. By releasing $M_{sw1}$ the energy stored in $L_1$ is released and creates a new sine wave that propagates into the loop. To generate the largest injected wave in the loop (i.e. sinusoidal wave on $V_1$) which ensures more reliable startup, the two previously discussed waves should be in phase at $V_1$. This means that the first falling edge of $V_{d1}$ coincides with the first peak of $V_1$ caused by releasing $M_{sw1}$. This can be achieved by the proper adjustment of $t_p$. The optimum value of $t_p$ is between ¼ to ½ of the oscillation period, which can be determined from simulation, for example. For lock state 2, another switch (i.e. $M_{sw2}$) on $V_2$ is needed to inject the disturbance signal into the loop with the same procedure. Note that for the sake of simplicity we disregard lock state 2.

Figure 18A:
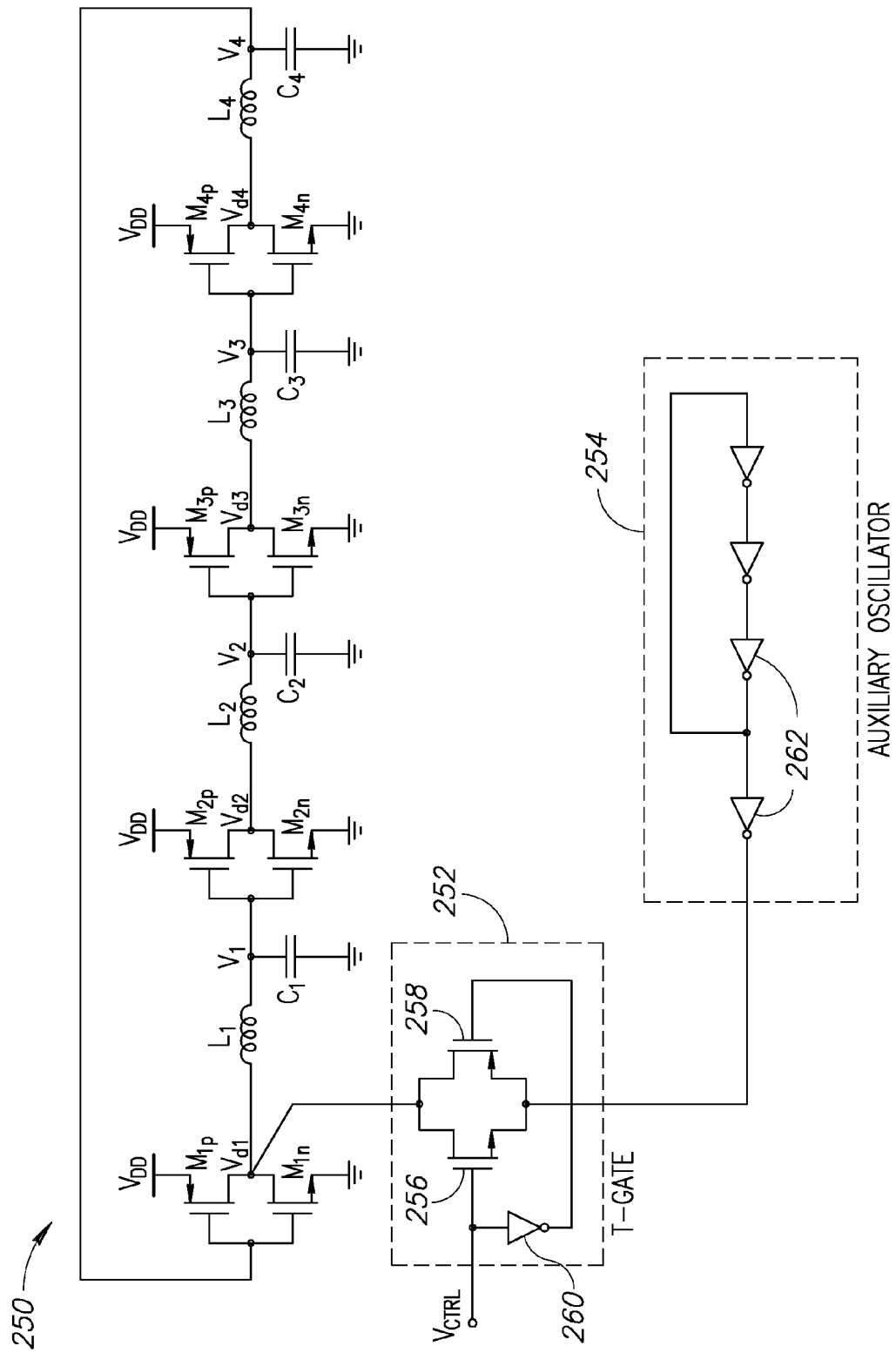
FIG. 18A is a circuit diagram illustrating an eighth embodiment of the ring oscillator of the present invention incorporating a startup circuit that includes an auxiliary oscillator.
Figure 18B:
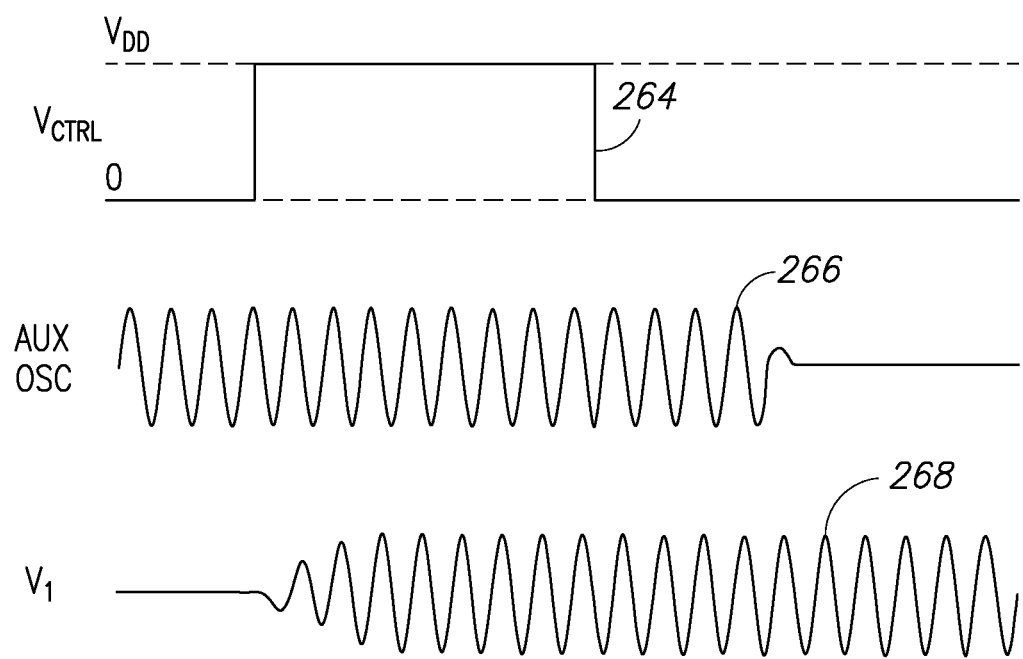
FIG. 18B is a diagram illustrating example waveforms of the circuit of FIG. 18A.

A circuit diagram illustrating an eighth embodiment of the ring oscillator of the present invention incorporating a startup circuit that includes an auxiliary oscillator is shown in FIG. 18A. A diagram illustrating example waveforms of the circuit of FIG. 18A is shown in FIG. 18B. In another circuit, generally referenced 250, an auxiliary oscillator 254 comprising inverters 262 is connected to one of the nodes in the feedback loop of the main oscillator for a short period of time, using a T-gate switch 252 comprising transistors 256, 258 and inverter gate 260 controlled by $V_{ctrl}$. If the auxiliary oscillator has sufficient driving strength, as well as an oscillation frequency almost the same as the main oscillator, it can launch oscillation of the main oscillator. Later, the auxiliary oscillator is disconnected and then turned off. In this manner, the power consumption overhead of the auxiliary oscillator is minimized. FIG. 18B shows the transient waveforms $V_{ctrl}$ 264, Aux Osc 266 and $V_1$ 268 of the startup circuit.

Figure 19:
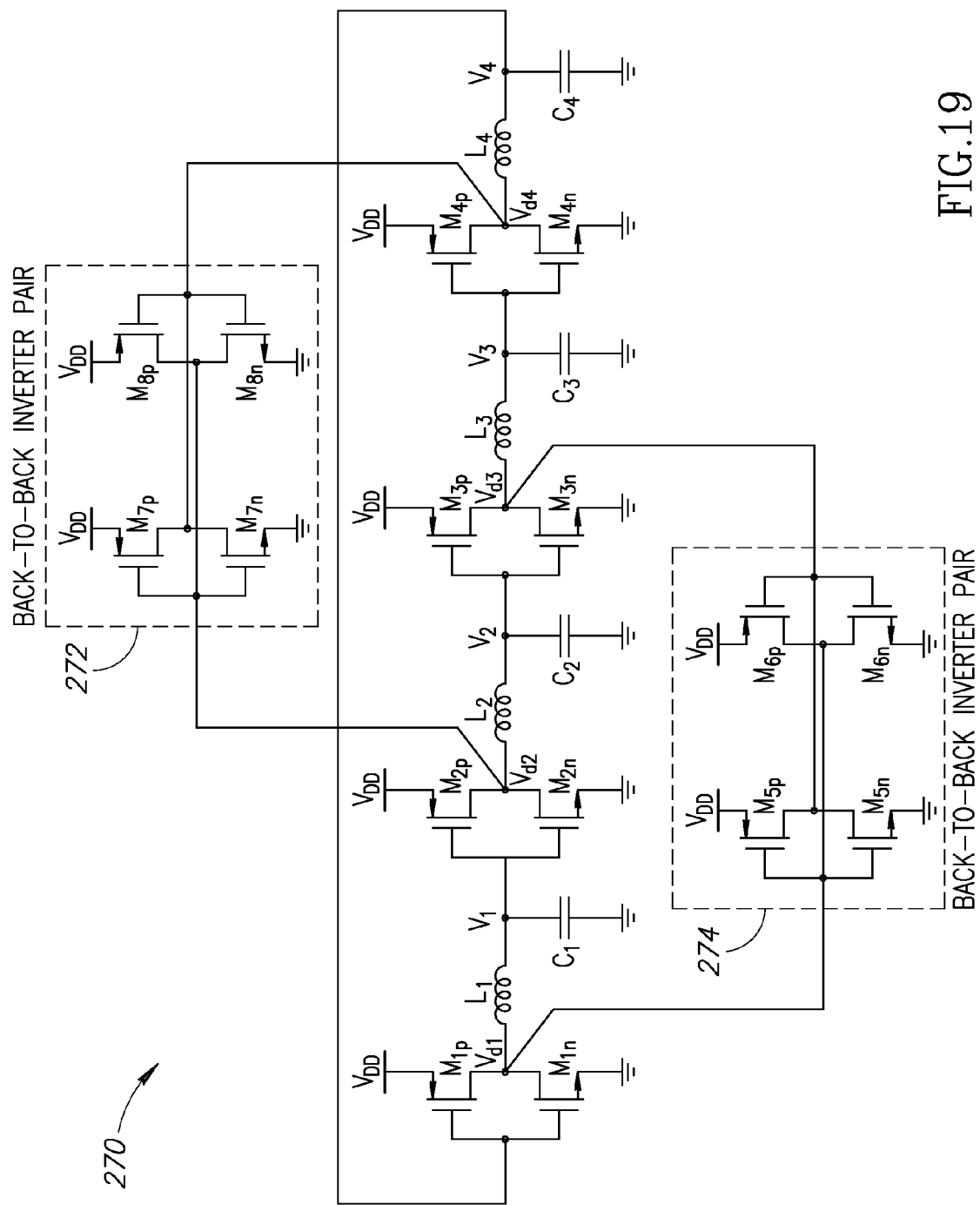
FIG. 19 is a circuit diagram illustrating a ninth embodiment of the ring oscillator of the present invention incorporating a startup circuit that includes back to back inverter pairs.

A circuit diagram illustrating a ninth embodiment of the ring oscillator of the present invention incorporating a startup circuit that includes back to back inverter pairs is shown in FIG. 19. The circuit, generally referenced 270, comprises a two back to back inverter pairs 272. Each pair of back-to-back inverters 272 forces a 180 degree phase shift between $V_{d1}$ and $V_{d3}$ and between $V_{d2}$ and $V_{d4}$. When these inverters are sized appropriately, the lock states are avoided and oscillation can be started easily. Note that these inverters having a small size can be combined with other start up circuits of FIGS. 17A and 18A as an additional aid to startup oscillation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A ring oscillator, comprising:
   a plurality of LC-tank based phase shifters configured in a loop;
   a plurality of amplifiers, each amplifier coupled to and associated with one of said phase shifters;
   wherein a gain of said plurality of amplifiers combined with voltage amplification of said phase shifters is sufficient to maintain oscillation in said loop; and
   a startup circuit connected to a node in said loop and active for a finite period of time, said startup circuit operative to generate an initial oscillation in said loop.

2. The ring oscillator according to claim 1, wherein each phase shifter comprises a series inductor and capacitor.

3. The ring oscillator according to claim 2, wherein said inductor is coupled to an output of said amplifier while one terminal of said capacitor is coupled to ground.

4. The ring oscillator according to claim 3, wherein an output of each phase shifter comprises a node between said inductor and said capacitor.

5. The ring oscillator according to claim 1, wherein one or more of said amplifiers comprises an inverter.

6. The ring oscillator according to claim 1, wherein one or more of said amplifiers comprises a nonlinear amplifier.

7. The ring oscillator according to claim 1, wherein said startup circuit is operative to generate a single square pulse.

8. The ring oscillator according to claim 1, wherein said startup circuit is turned off and disconnected after oscillation in said loop is established.

9. The ring oscillator according to claim 1, wherein said startup circuit comprises back to back inverter pairs coupled to one or more nodes in said loop.

10. The ring oscillator according to claim 1, further comprising a plurality of first tuning capacitors, each first tuning capacitor coupled to and associated with an input of one of said amplifiers and operative to provide relatively coarse frequency tuning control of said ring oscillator.

11. The ring oscillator according to claim 1, further comprising a plurality of second tuning capacitors, each second tuning capacitor coupled to and associated with an output of one of said amplifiers and operative to provide relatively fine frequency tuning control of said ring oscillator.

12. A quadrature ring oscillator, comprising:
a plurality of four phase shifters, each of substantially 90 degrees, configured in a loop;
a plurality of four active circuits, each active circuit coupled in series with one of said phase shifters;
a plurality of tuning capacitors, each tuning capacitor coupled to and associated with one of said active circuits;
a startup circuit connected to one or more nodes in said loop and active for a finite period of time, said startup circuit operative to generate an initial oscillation in said loop;
wherein a gain of said plurality of active circuits combined with voltage amplification of said phase shifters is sufficient to maintain oscillation in said loop; and
wherein each active circuit is arranged in a single ended configuration.

13. The ring oscillator according to claim 12, wherein the gain of said active circuits combined with voltage amplification of said phase shifters is sufficient to satisfy Barkhausen phase and gain criteria and cause said loop to oscillate.

14. The ring oscillator according to claim 12, wherein each phase shifter comprises a series LC-tank.

15. The ring oscillator according to claim 12, wherein said startup circuit comprises an auxiliary oscillator.

16. The ring oscillator according to claim 14, wherein an inductor in said LC-tank is coupled to an output of said active circuit while one terminal of a capacitor in said LC-tank is coupled to ground.

17. The ring oscillator according to claim 16, wherein an output of each phase shifter comprises a node between said inductor and said capacitor.

18. The ring oscillator according to claim 12, wherein one or more of said active circuits comprises an inverter.

19. The ring oscillator according to claim 12, wherein one or more of said active circuits comprises a nonlinear amplifier.

20. The ring oscillator according to claim 12, wherein one or more of said active circuits comprises a buffer.

21. The ring oscillator according to claim 12, wherein said startup circuit is operative to generate a single square pulse.

22. The ring oscillator according to claim 12, wherein said startup circuit is disconnected after oscillation in said loop is established.

23. The ring oscillator according to claim 12, wherein said startup circuit comprises back to back inverter pairs coupled to one or more nodes in said loop.

24. The ring oscillator according to claim 12, wherein said tuning capacitors comprise first tuning capacitors, each first tuning capacitor coupled to an input of a respective active circuit and operative to provide relatively coarse frequency tuning control of said ring oscillator.

25. The ring oscillator according to claim 12, wherein said tuning capacitors comprise second tuning capacitors, each second tuning capacitor coupled to an output of a respective active circuit and operative to provide relatively fine frequency tuning control of said ring oscillator.

26. The ring oscillator according to claim 12, wherein said tuning capacitors comprise:
first tuning capacitors, each first tuning capacitor coupled to an input of a respective active circuit and operative to provide relatively coarse frequency tuning control of said ring oscillator; and
second tuning capacitors, each second tuning capacitor coupled to an output of a respective active circuit and operative to provide relatively fine frequency tuning control of said ring oscillator.

27. The ring oscillator according to claim 1, wherein said startup circuit comprises an auxiliary oscillator.

28. The ring oscillator according to claim 1, wherein said startup circuit is operative to inject one or more pulses into said loop.

29. The ring oscillator according to claim 12, wherein said startup circuit is operative to inject one or more pulses into said loop.

* * * * *